(12) United States Patent
Chang et al.

(10) Patent No.: US 7,977,788 B2
(45) Date of Patent: Jul. 12, 2011

(54) CONTACT STRUCTURE HAVING A COMPLIANT BUMP AND A TESTING AREA

(75) Inventors: Shyh-Ming Chang, Hsinchu (TW); Sheng-Shu Yang, Hsinchu (TW); Chao-Chyun An, Hsinchu (TW)

(73) Assignees: Taiwan TFT LCD Association, Hsinchu (TW); Chunghwa Picture Tubes, Ltd., Taoyuan (TW); Au Optronics Corp., Hsinchu (TW); Quanta Display Inc., Tao Yuan Shien (TW); Hannstar Display Corp., Taipei (TW); Chi Mei Optoelectronics Corp., Tainan County (TW); Industrial Technology Research Institute, Hsinchu (TW); Toppoly Optoelectronics Corp., Miao-Li County (TW)

( * ) Notice: Subject to any disclaimer, the term of this patent is extended or adjusted under 35 U.S.C. 154(b) by 716 days.

(21) Appl. No.: 11/603,909

(22) Filed: Nov. 24, 2006

(65) Prior Publication Data

US 2008/0023830 A1    Jan. 31, 2008

(30) Foreign Application Priority Data

Jul. 28, 2006 (TW) .............................. 95127901 A

(51) Int. Cl.
*H01L 23/48* (2006.01)

(52) U.S. Cl. ................ 257/737; 257/741; 257/E23.021
(58) Field of Classification Search ................... 257/737
See application file for complete search history.

(56) References Cited

U.S. PATENT DOCUMENTS

| | | | |
|---|---|---|---|
| 4,749,120 A | 6/1988 | Hatada et al. | |
| 5,477,087 A | 12/1995 | Kawakita et al. | |
| 5,508,228 A * | 4/1996 | Nolan et al. | 438/614 |
| 5,707,902 A | 1/1998 | Chang et al. | |
| 5,877,556 A * | 3/1999 | Jeng et al. | 257/737 |

FOREIGN PATENT DOCUMENTS

TW          324847         1/1998

* cited by examiner

*Primary Examiner* — Marcos D. Pizarro
*Assistant Examiner* — Eva Yan Montalvo
(74) *Attorney, Agent, or Firm* — Rabin & Berdo, P.C.

(57) ABSTRACT

A contact structure having both a compliant bump and a testing area and a manufacturing method for the same is introduced. The compliant bump is formed on a conductive contact of the silicon wafer or a printed circuit board. The core of the bump is made of polymeric material, and coated with a conductive material. In particular, the compliant bump is disposed on the one side of the conductive contact structure that includes both the bump and the testing area, wherein the testing area allows the area to be functionality tested, so as to prevent damage of the coated conductive material over the compliant bump during a probe testing.

15 Claims, 23 Drawing Sheets

CONTACT STRUCTURE HAVING A COMPLIANT BUMP AND A TESTING AREA

BACKGROUND OF THE INVENTION

1. Field of the Invention

The present invention relates to a contact structure having a compliant bump and a testing area and a manufacturing method for the same, and more particularly to a shift conductive compliant bump formed as an input/output contact on a silicon wafer.

2. Description of Related Art

To develop the field of manufacturing a high-density integrated circuit, an IC chip requires a highly-reliable physical and electrical structure. In order to manufacture a high-density IC structure, such as a high-resolution liquid crystal panel, in a tiny area, the control ICs used therein also need to be arranged densely. As such, conventional metal bumps formed as the conductive contacts used on the wafer were developed. The bump is either a gold bump, an eutectic solder bump, or a high lead solder bump, etc. Because the metal bumps used as the IC signal contacts are used upon smaller packaged products having a plurality of pins, the conventional technology of bonding or leading is not adopted.

U.S. Pat. No. 4,749,120 discloses a gold bump used as the conductive medium between the IC chip and the substrate. However, the process is the same as an assembling process combining the IC chip and the substrate and causes the chip to crack since a recovering force is generated in the duration of the process. Therefore, the prior art incorporates a conductive particle with elasticity or a relevant material of the like for preventing the above-mentioned crack.

U.S. Pat. No. 5,707,902 shown in FIG. 1 discloses a cross-sectional view of a bump structure formed on a circuit board. The major structure has a metal pad 16 formed on a substrate 1, and a passivation layer 18 having a protective function. The bump structure on the substrate 1 includes a polymer 12 and a conductive metal layer 14 coated thereon. In particular, the polymer 12 reduces the recovering force between the substrate and the circuit board.

A bump electrode for connecting electronic components disclosed in U.S. Pat. No. 5,477,087 is shown in FIG. 2. The cross-sectional view of the bump electrode on the circuit board shows a bump electrode 20 formed on a LSI chip 21, and an aluminum electrode 22 on the LSI chip 21. The electrode can be the conductive medium between the bumps and the circuit, and coated with insulation 23, furthermore, a barrier-metal layer 24 is formed between the etched insulations 23. The bump electrode 20 includes a resin 25, numerous cavities 26 thereon, and a conductive metal layer 27 coated thereon. The above-mentioned resin 25 in the bump electrode 20 and the cavities 26 are a compliant structure, which prevents damage occurring in the process of combining the chip with the bump electrode 20 or a circuit board and other components.

A further prior art is U.S. Pat. No. 5,508,228 which discloses the compliant electrically connective bumps for an adhesive flip chip integrated circuit device. FIG. 3 shows a three-dimensional view of the conductive bump, which is a portion of the IC 30. The plurality of conductive bumps 31 thereon is formed as the I/O contacts, and the conductive bumps 31 are prominent bumps. In particular, the top surface 34 and the adjacent side structure 36 connect to the bond pads 33 coupling to the IC 30 via the base 38, and the conductive bumps 31 connect to the wires 32 of the IC 30 via the bond pad 33. Polymer is used to manufacture the core of the above conductive bumps 31, so the bumps have compliant features.

The bump structures disclosed in the above-mentioned art are required to pass a variety of electrical examinations before being sold. The metal layer coated on the compliant bump structure can be broken when being probed by a probe since the metal layer is very thin. TW Patent No. 324847 discloses a complex bump structure used for an IC. FIG. 4 shows the input/output contacts of the IC, wherein the complex-type bump structure is formed on a substrate 40 having an input/output terminal pad 42 and a passivation layer 41 coated thereon. A first metal layer 43 is formed on the input/output terminal pad 42 and the passivation layer 41. Next, the patterned complex bump 44 is formed on the first metal layer 43 and on the input/output terminal pad 42 moved a shift distance away. After that, the first metal layer 43 and the complex bump 44 are formed as a second metal layer 45. The mentioned complex bump 44 forms an opening so as to electrically connect to the lower structure and other electric components, and the opening can be an area used for providing a good probing place.

SUMMARY OF THE DISCLOSURE

In the conventional art, the polymeric material coated with a conductive layer forms a conductive bump, which prevents damage suffered on the electrical components when the conductive bump is pressed on to a substrate. However, the surface of the conductive layer can still be damaged when being probed by a probe. Even though the conventional arts disclose the bump structure used for probing by the probe, the present invention provides a different contact structure merely having a conductive metal layer coated on the bump structure. Furthermore, the conductive metal pad of the present invention is provided to jointly have both the bump structure and a testing area.

The present invention relates to a contact structure having a compliant bump and a testing area and the manufacturing method of the same. The compliant bump forms the conductive contact of a silicon wafer or a circuit board. The core of the compliant bump is formed by a polymeric material and coated by a conductive material. One of the preferred embodiments of the present invention has the bump structure disposed on a side, therefore, the contact structure can include both the bump structure and the testing area.

A silicon wafer is used as the metal pad of an input/output contact in the preferred embodiment of the present invention, and the metal pad of the contact is formed having both the compliant bump and the testing area. In particular, the surface metal of the compliant bump provides electrical connectivity, and the testing area provides the area to perform the electrical probe.

In the preferred embodiment of the present invention, the manufacturing method has a first step of preparing a substrate, wherein the contact structure is included at least. Afterward, the polymeric material is coated on the contact structure, and the polymeric material is etched in the steps of developing/etching. Next, the portion which has not undergone the steps of developing/etching forms the compliant bump, and the portion undergoing the steps forms the testing area. After that, the conductive material is coated thereon, and the compliant bump forms a conductive bump so as to electrically connect with the testing area by means of the conductive material. Therefore, the conductive material coated on the bump won't be damaged by probing the electrical characteristics of the contact structure.

Another embodiment of the present invention shows the steps of the method for manufacturing the contact structure. A silicon wafer is prepared in the first step, and the wafer has a metal pad that is an input/output terminal, and a passivation layer that is a body used to protect the wafer. Next, a polymeric material is coated upon the silicon wafer. The polymeric material is developed and etched afterward, and the portion that has not undergone the steps of developing/etching forms a compliant bump, and the rest portion of the material forms a testing area. Next, a micro-bump structure is disposed on the compliant bump, and a conductive metal layer is coated on the compliant bump and the testing area. The compliant bump forms a conductive bump, and the conductive bump and the testing area electrically connect with the conductive metal layer. Thereby the conductive bump and the testing area are turned on. The electrical characteristics of the contact structure are obtained by means of the testing area, and the conductive metal layer coated on the bump is not damaged.

BRIEF DESCRIPTION OF DRAWINGS

The present invention will be readily understood by the following detailed description in conjunction with accompanying drawings, in which.

DETAILED DESCRIPTION OF THE PREFERRED EMBODIMENTS

To understand the technology, means and functions adopted in the present invention further, reference is made to the following detailed description and attached drawings. The invention shall be readily understood deeply and concretely from the purpose, characteristics and specifications. Nevertheless, the present invention is not limited to the attached drawings and embodiments in the following description.

There are two shortcomings in the conventional art that the present invention aims to overcome. Firstly, the cracks that occur at a contact structure during the process of pressing by a recovering force, and secondly the problem of it being difficult to perform a test since there is no specific testing area or any conductive bump on the contact structure to be tested. For overcoming the shortcomings, the present invention provides a contact structure having a compliant bump and a testing area, and a manufacturing method for the same. The compliant bump forms the conductive contacts, such as the input/output terminals, disposed on an IC chip or a PCB. Furthermore, the core of the bump is made of a polymeric material or polymer, and the bump is coated with a conductive material. The structure of the preferred embodiment of the present invention prevents the above-mentioned cracks from appearing in the manufacturing process.

The preferred embodiment uses only one conductive metal layer, and the compliant bump disposed on part of the contact structure forms the conductive bump moved a shift distance away. Moreover, the contact structure has the bump and the testing area simultaneously, wherein the testing area is used for external testing to prevent the coated metal layer from being damaged by direct probing of the polymeric compliant bump.

Flip-chip technology of the prior art is applied to a manufacturing process of a liquid crystal display, wherein a substrate that is mostly made of glass, and bare chip technology is used to connect the other components with the glass substrate directly, namely a chip on glass (COG). In particular, a bare chip technology can reduce the signaling distance between the chip and the substrate, which is compatible with packaging for high-speed devices. After that, the size of the IC can be scaled down, the packaging density can be raised, and the weight can be reduced, so the display panel can be lighter and reach the high-resolution requirements of the panel.

Figure 1:
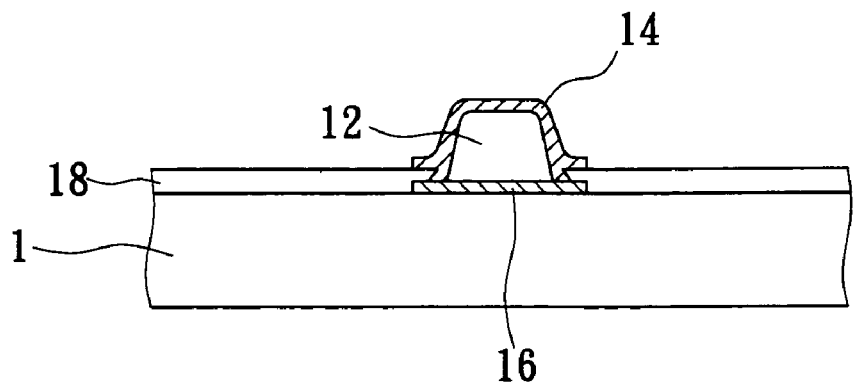
FIG. 1 is a schematic diagram of the cross-sectional view of a bump structure on a PCB of the prior art.
Figure 2:
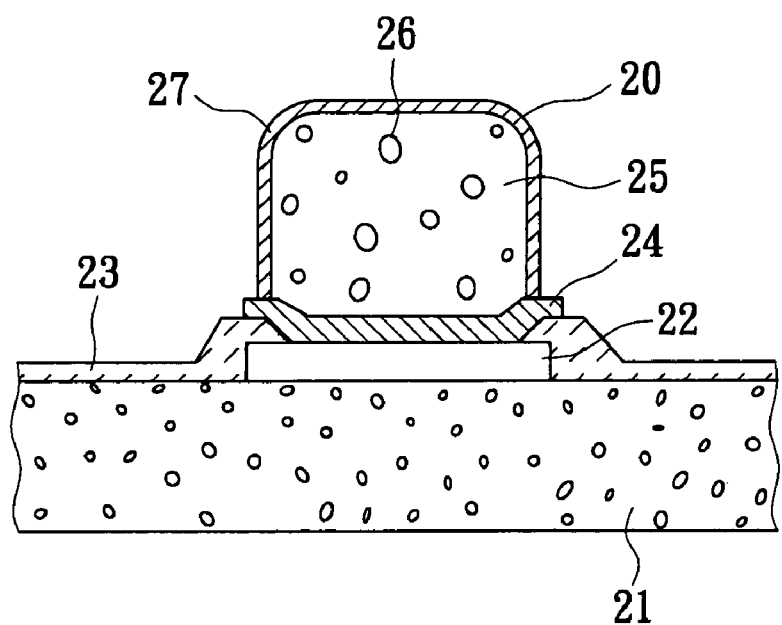
FIG. 2 shows a cross-sectional diagram of the conductive electrode of the prior art.
Figure 3:
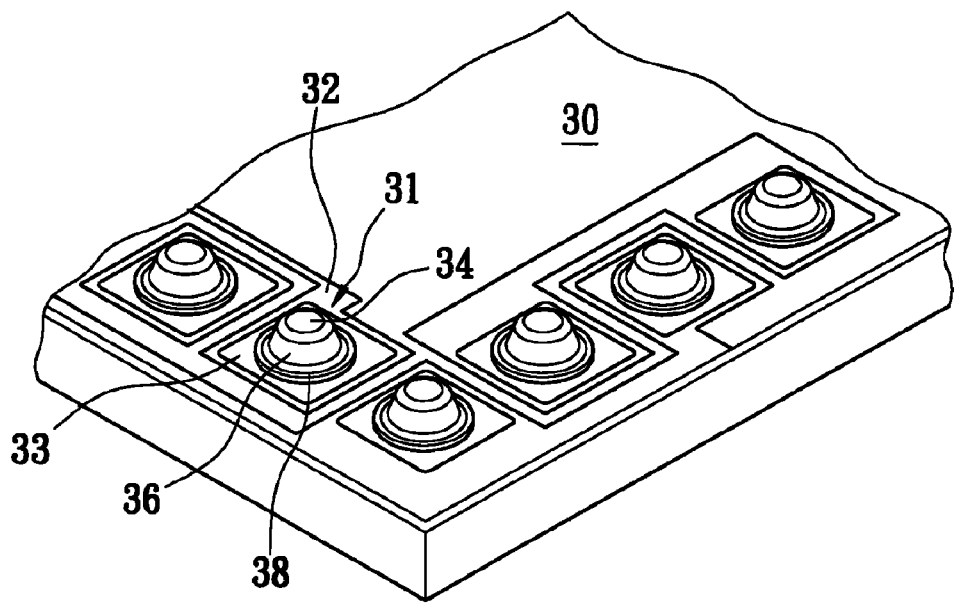
FIG. 3 shows a perspective diagram of a conductive bump formed on an integrated circuit chip of the prior art.
Figure 4:
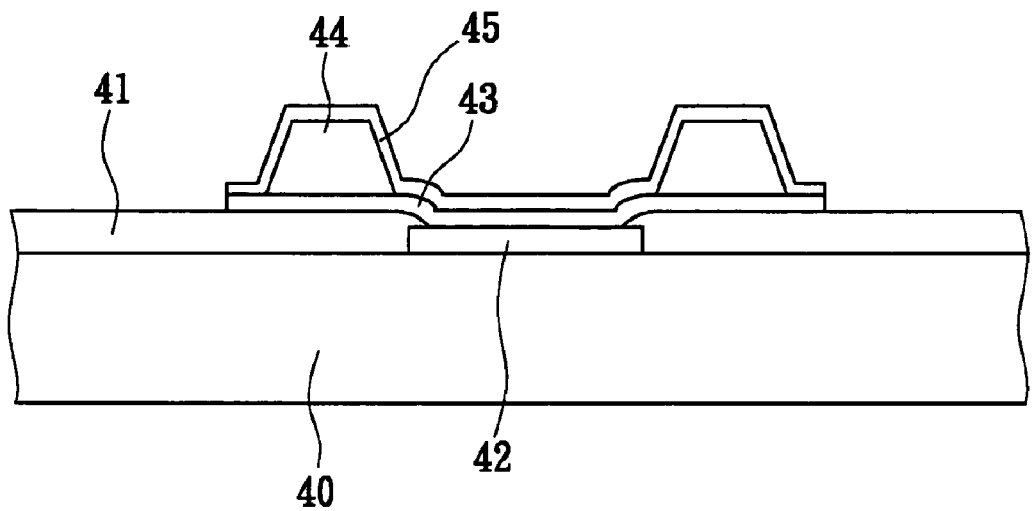
FIG. 4 is a schematic diagram of the bump structure of the prior art.
Figure 5:
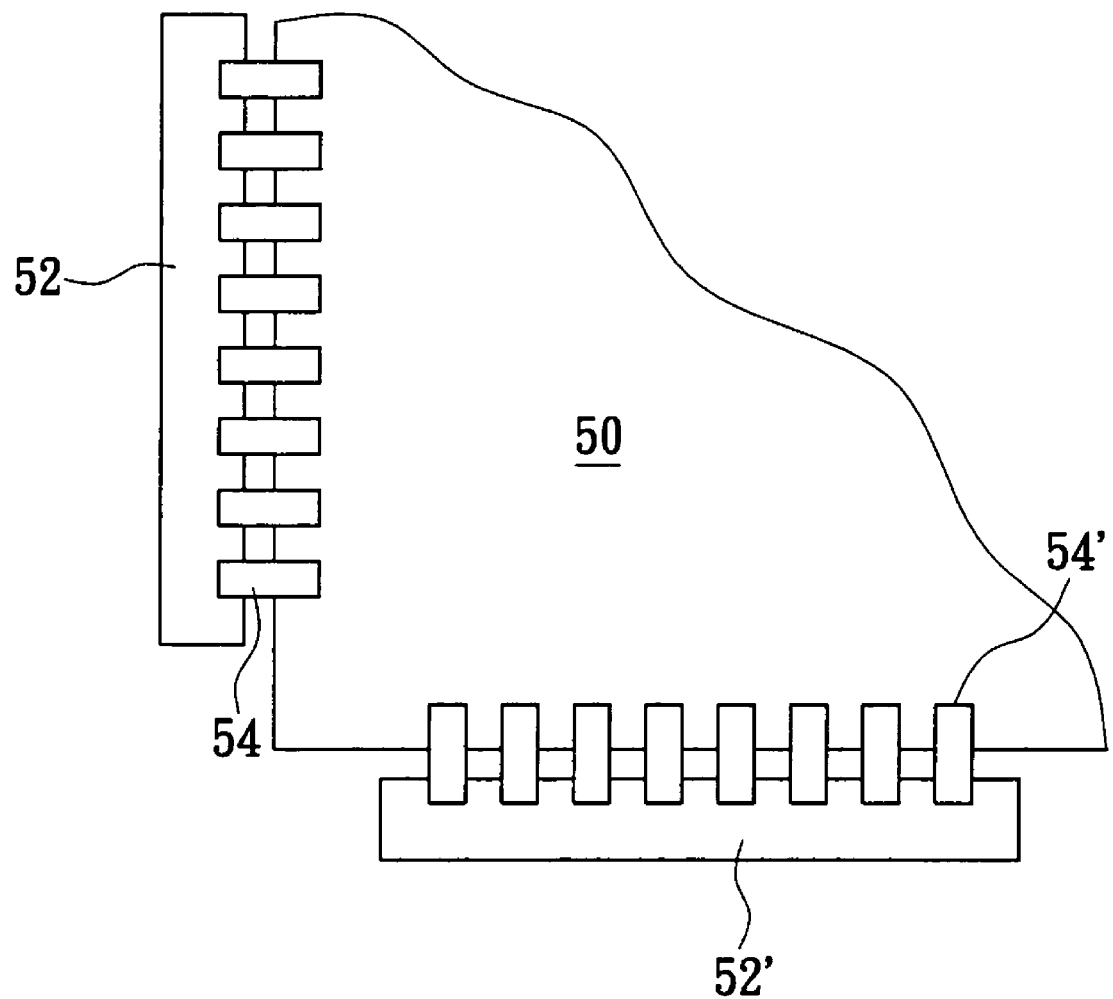
FIG. 5 is a schematic diagram of the contact structure applied to a glass substrate and a chip of the present invention.

Reference is made to FIG. 5, which shows a portion of the glass substrate 50 of a liquid crystal display. A plurality of driver ICs 54, 54' or other chips for signaling is disposed on the two sides of the substrate using the above-mentioned method of flip-chip technology to electrically connect to PCBs 52, 52'. The contact structure having the compliant bump and the testing area of the present invention can be used for the chips bridging the PCBs 52, 52' and the glass substrate 50 to electrically connect with each other.

Figure 6:
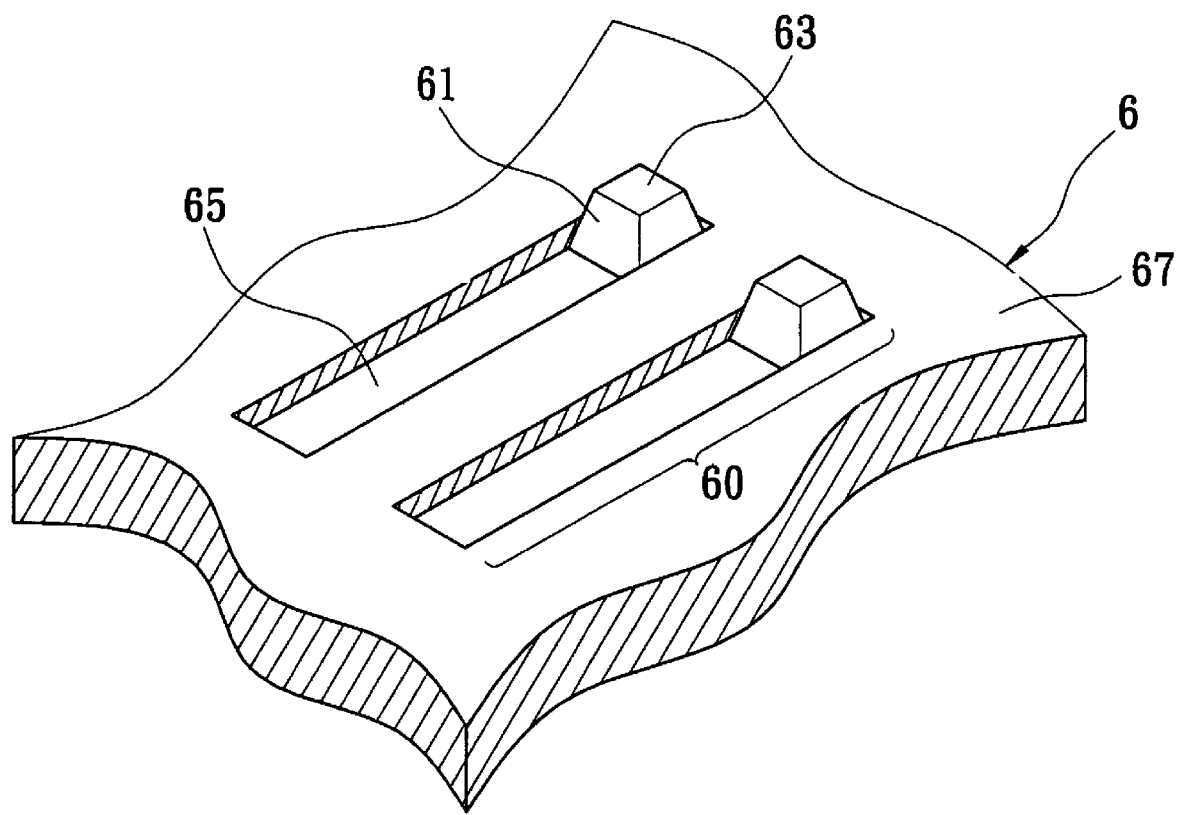
FIG. 6 shows a schematic diagram of the contact structure having a compliant bump and a testing area of the present invention.

One of the preferred embodiments of the present invention is shown as FIG. 6. A metal pad 60 having both the polymeric compliant bump 61 and the testing area 65 are illustrated. The metal pad 60 is disposed on a contact above the substrate 6, such as the input/output contacts of an integrated circuit chip, or the conductive contacts between a circuit board and other electronic components. The structure shown in FIG. 6 includes one or a plurality of metal pads 60 disposed on the substrate 6. In an exemplary embodiment, the substrate 6 is provided which electrically couples to other electronic components. The preferred embodiment of the substrate 6 forms the integrated circuit chip, wherein a passivation layer 67 is coated above and disposed on the ambient area of the metal pad 60. Therefore, the metal pad 60 is exposed to the uncovered passivation layer 67.

In this present embodiment, the polymeric compliant bump 61 forms a pyramid-shaped bump. The top surface of the compliant bump 61 and another part thereon are coated with the conductive material 63 so as to electrically contact the metal pad 60 and other components contacting the bump. The polymeric compliant bump 61 is disposed on the partial surface of the above-mentioned metal pad 60, wherein the area not covered by the polymeric compliant bump 61 forms a testing area 65, which is provided to be probed by contacting the area. The conductive material 63 coated on the polymeric compliant bump 61 is also coated on the testing area 65 of the metal pad 60, whereby the bump 61 and the metal pad 60 are contacted. The mentioned polymeric compliant bump 61 with the conductive material 63 coated thereon forms a conductive compliant bump, such as the adjacent structures lined up in a row as can be seen in the figure. The bump can be disposed on any position upon the metal pad 60, or can span the area of the metal pad 60.

Figure 7A:
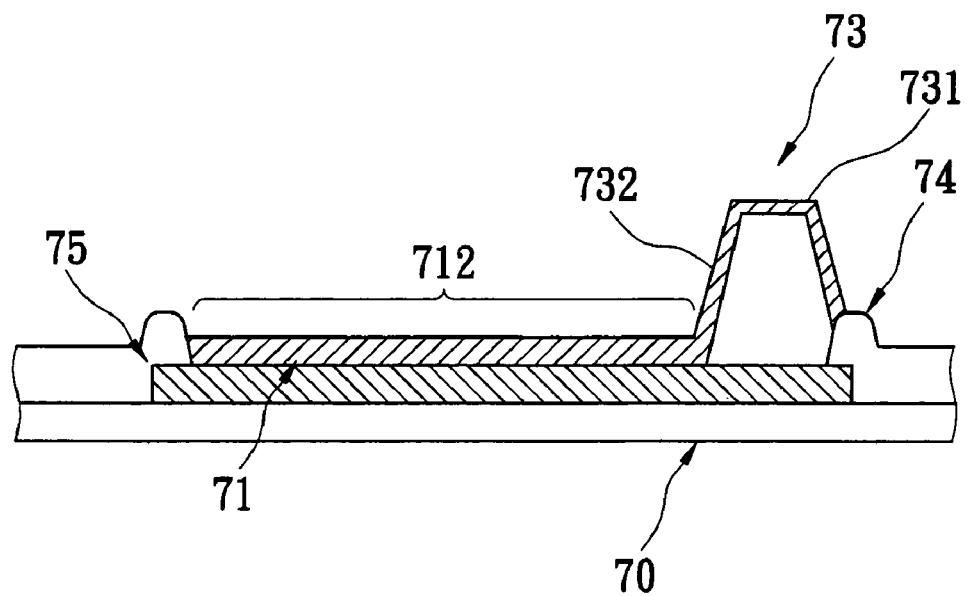
FIGS. 7A through 7I show a cross-sectional diagram of the contact structure of the present invention.

Reference is made to FIG. 7A, which shows a profile of the embodiment shown in FIG. 6. The metal pad has both the polymeric complaint bump and the testing area. In this embodiment, the under structure is an integrated circuit chip 70, and the surface thereon includes a metal pad 75, which is used to electrically connect the chip and other electronic components. Moreover, a passivation layer 74 is disposed on the ambient area of the metal pad 75 and used to protect the integrated circuit chip 70. In particular, the metal pad 75 is developed outside the passivation layer 74.

Next, a polymeric compliant bump 73 is disposed on a partial area of the surface of the mentioned metal pad 75. Referring to an exemplary embodiment shown in FIG. 7A, the compliant bump 73 is disposed at the end of the metal 15, pad 75. The area of the metal pad 75 that has not been coated by the polymeric complaint bump 73 forms a testing area 712, which is provided to be contacted by a probe. A conductive layer 71 is formed on the top surface 731 of the polymeric compliant bump 73, and the conductive layer 71 extends from the compliant bump 73 to the top surface of the metal pad 75 by passing through the side part 732 of the compliant bump 73. Therefore, the polymeric compliant bump 73 connects to the mentioned metal pad 75 via the conductive layer 71.

Figure 7B:
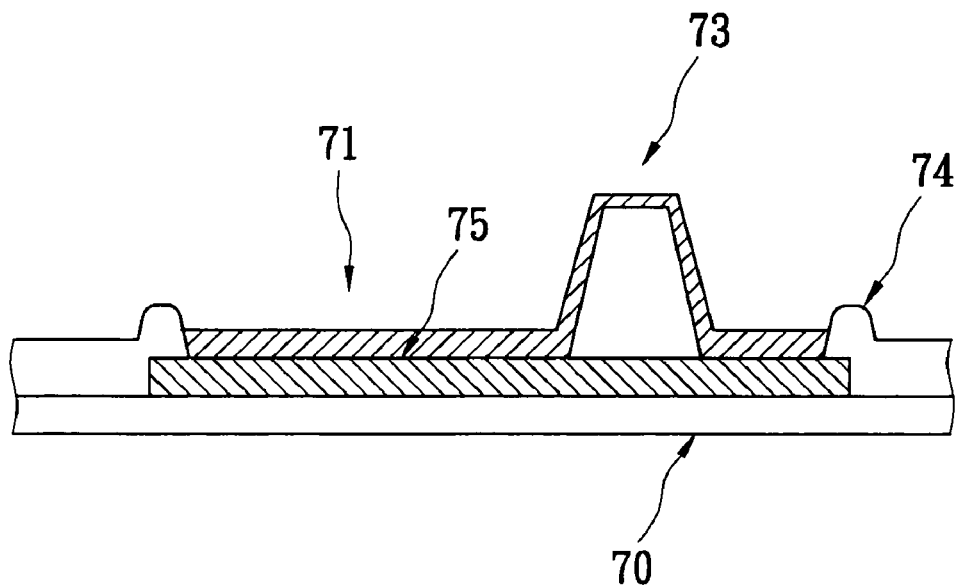

FIG. 7B shows a schematic diagram of another embodiment of the mentioned contact structure. FIG. 7B shows that the polymeric compliant bump 73 can be disposed on any area of the metal pad 75, or a partial area thereon can be coated with the passivation layer 74. Namely, part of the material of the polymeric compliant bump 73 is coated upon the passivation layer 74.

Figure 7C:
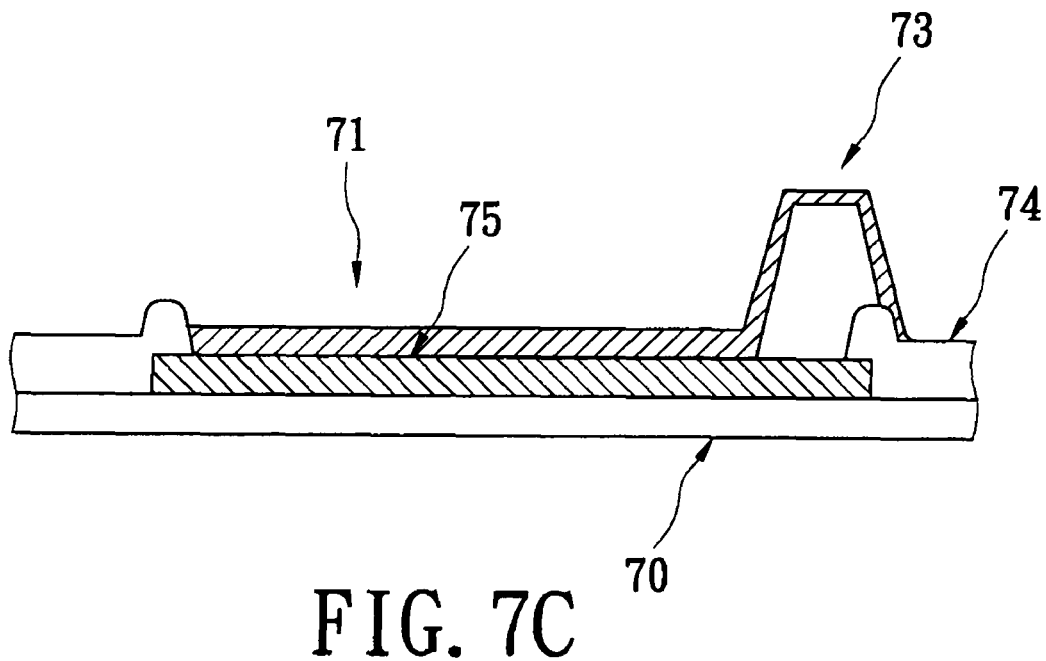

The aforementioned FIG. 7A shows the edge of the polymeric compliant bump 73 covering one end of the passivation layer 74. FIG. 7B shows the edge of the polymeric compliant bump 73 maintaining a distance from the passivation layer 74. FIG. 7C, in particular, shows the edge of the polymeric compliant bump 73 covering a greater amount of the passivation layer 74 than in FIG. 7A.

Figure 7D:
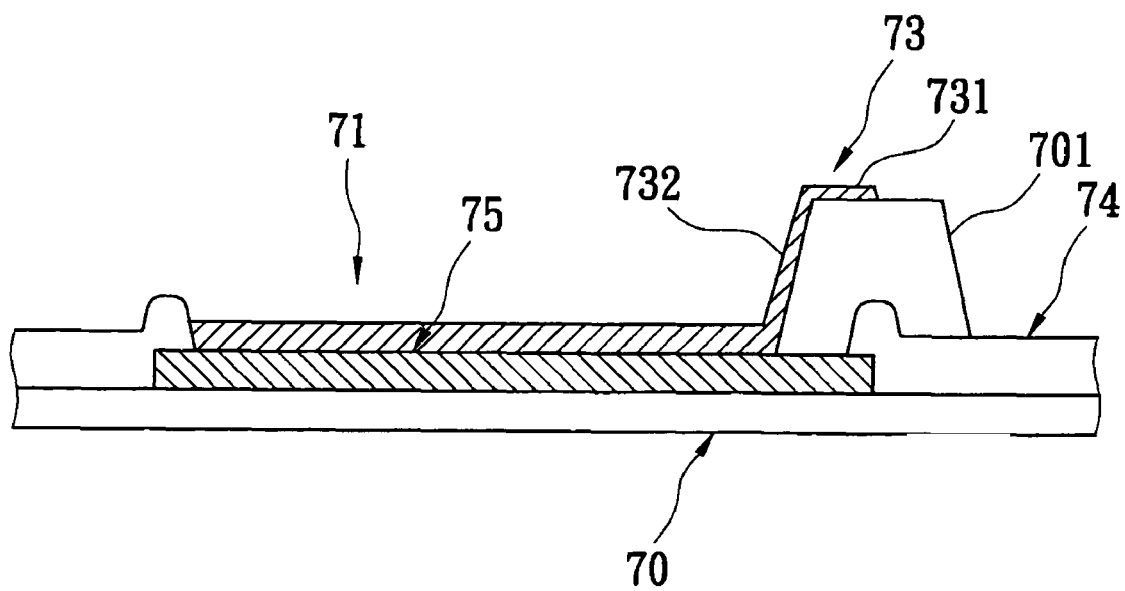

Next, reference is made to FIG. 7D showing the edge of the polymeric compliant bump 73 covering the top side of the passivation layer 74. Additionally, the partial side part 701 or the partial top surface of the polymeric compliant bump 73 doesn't include the conductive layer 71 since the conductive layer 71 coated on the bump 73 merely needs the conductive layer 71 on the side part 732 to conduct the metal pad 75. In other words, the conductive layer 71 on the top surface 731 of the polymeric compliant bump 73 conduct the testing area 712 passes through the conductive layer 71 on the side part 732. Therefore, the ambient surface of the polymeric compliant bump 73 can be fully or partially coated by the conductive layer 71, and both of the above embodiments can achieve electrical conduction.

Figure 7E:
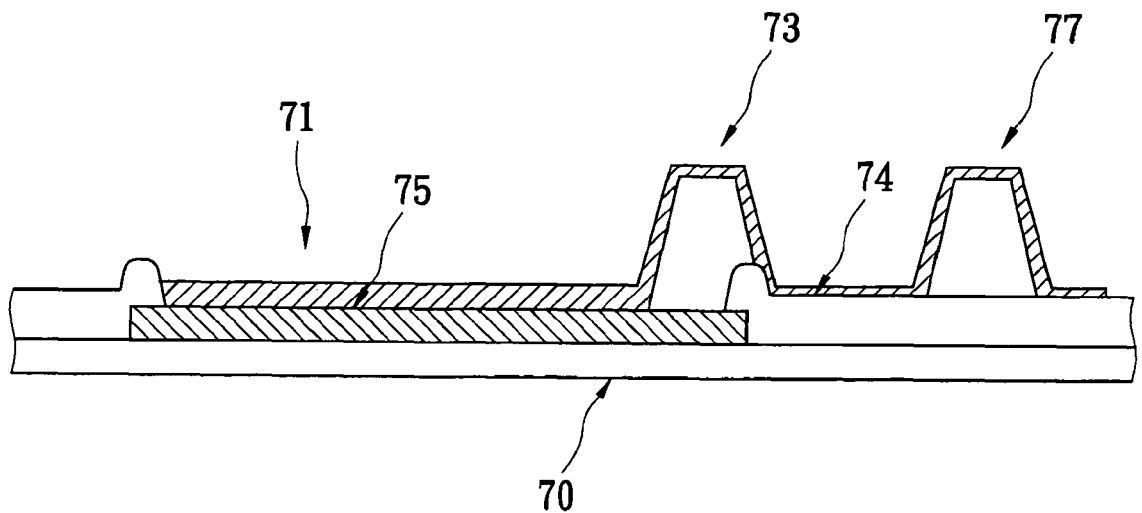

FIG. 7E shows a derivational embodiment from the embodiment shown in FIG. 7D. On one side of the metal pad 75, an external compliant bump 77 is disposed on the outside of the polymeric compliant bump 73 corresponding to the contact structure. The edge of the polymeric compliant bump 73 covers one end of the passivation layer 74. The conductive layer 71 not only covers the top surface of the polymeric compliant bump 73, but also covers the external compliant bump 77. This external compliant bump 77 is used to enhance the total contact area and the number of contact bumps, so as to reduce the contact structure's resistance and prevent cracks from appearing.

Figure 7F:
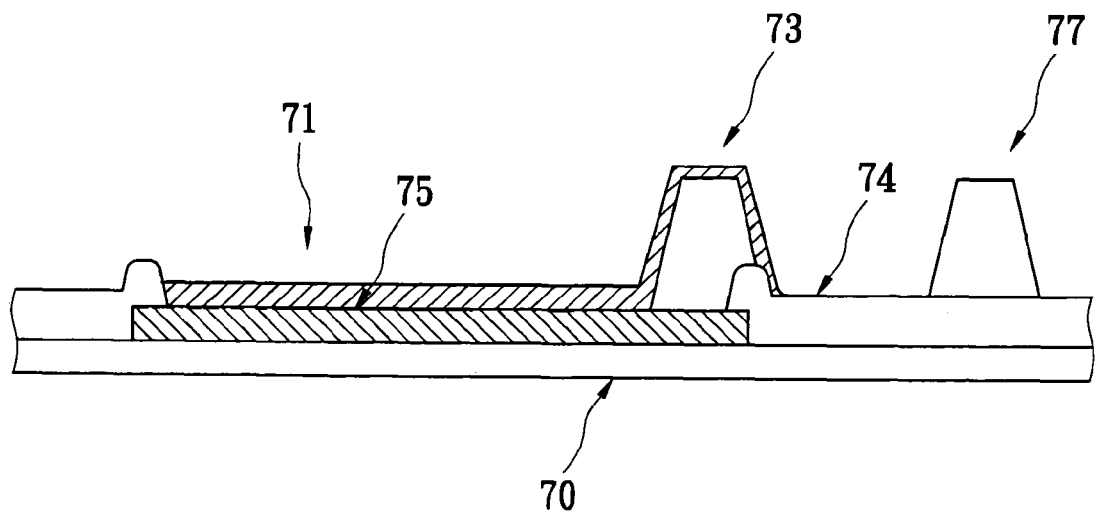

Similar to FIG. 7E, FIG. 7F also shows an external compliant bump 77 disposed on an outside of the polymeric compliant bump 73 corresponding to the contact structure. In particular, this external compliant bump 77 is a dummy bump. The conductive layer 71 is not coated on this external compliant bump 77, so is dummy bump is used as a stopper for electrical signals, and to protect the polymeric complaint bump 73 from cracking.

Figure 7G:
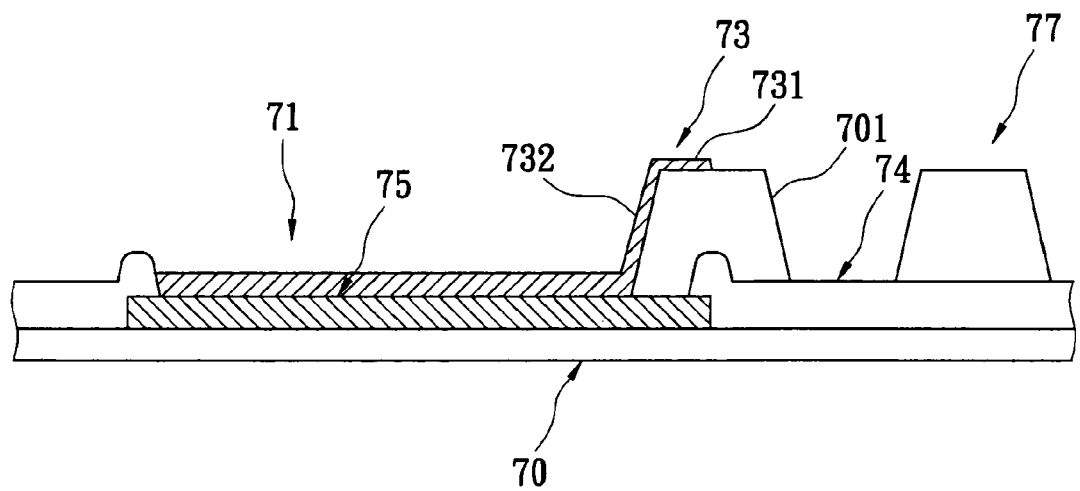

The embodiment shown in FIG. 7G refers to the embodiment shown in FIG. 7D. The edge of the polymeric compliant bump 73 covers the top side of the passivation layer 74. The partial side part 701 and partial top surface of the polymeric compliant bump 73 are not coated with the conductive layer 71. In particular, the external compliant bump 77 is also disposed on outside of the contact structure. This external compliant bump 77 is also a dummy bump acting as a stopper of electrical signals, and for protecting the bump 73 from cracking.

Figure 7H:
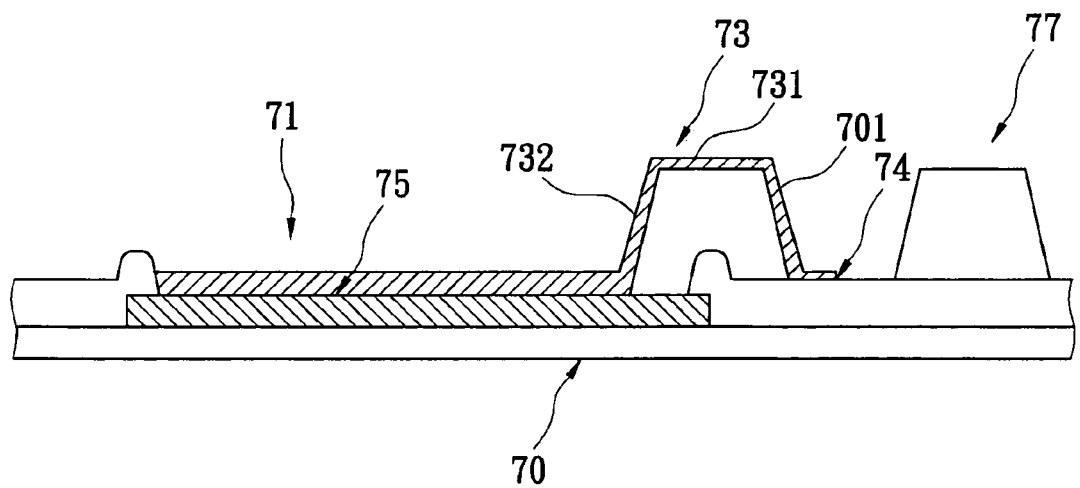

FIG. 7H shows an embodiment similar to FIG. 7D, where the edge of the polymeric compliant bump 73 covers the top side of the passivation layer 74, and the top surface of the polymeric compliant bump 73 is coated with the conductive layer 71. The external compliant bump 77 is also disposed on an outside of the contact structure. This external compliant bump 77 is also a dummy bump acting as a stopper of electrical signals, and for protecting the bump 73 from cracking.

Figure 7I:
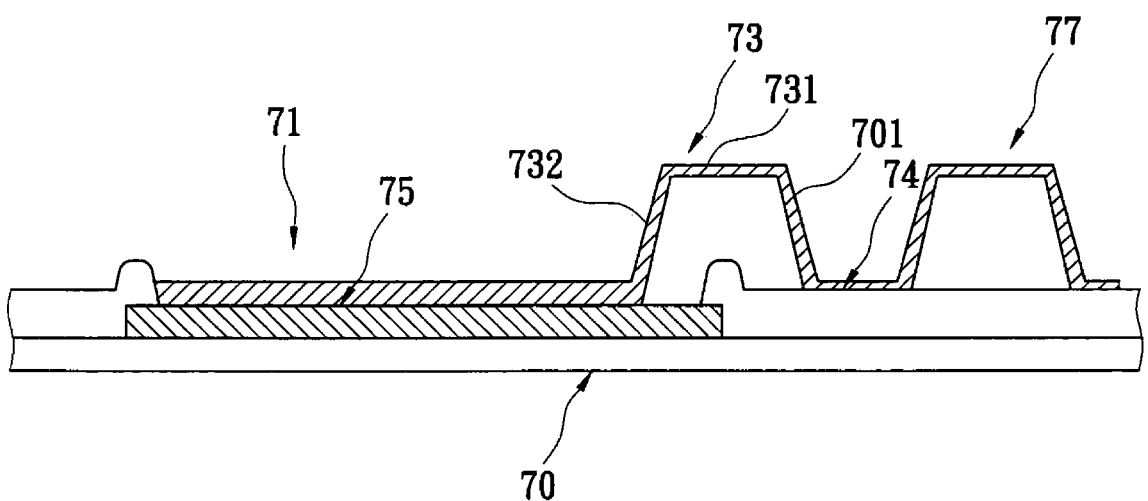

The embodiment shown in FIG. 7I is similar to the embodiment shown in FIG. 7H. The edge of the polymeric compliant bump 73 covers the passivation layer 74. However, not only the top surface of the polymeric compliant bump 73 but also the surfaces (top and side) of the external compliant bump are coated with the conductive layer 71. This external compliant bump 77 is used to enhance signal transmission and the contact between the electronic components. Protection of the polymeric compliant bump 73 from cracking is also provided.

Figure 8A:
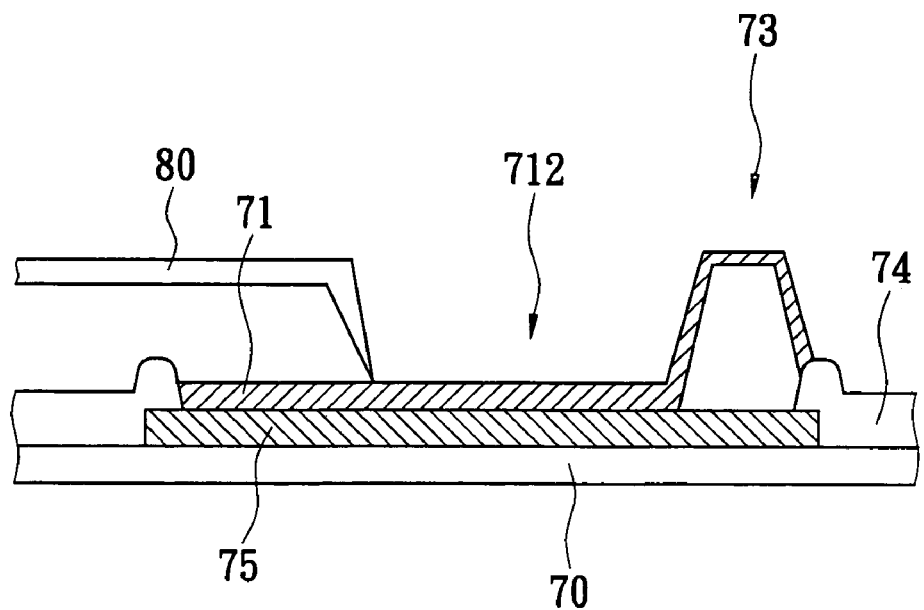
FIGS. 8A and 8B show the embodiment of a probe contacting the testing area of the contact structure.

FIG. 8A shows a probe 80 contacting the testing area 712 of the contact structure of the present invention. The contact structure having the compliant bump and the testing area is used to improve the contact structure of the prior art, which doesn't provide any specific area for probing. Furthermore, the conductive layer coated on the polymeric compliant bump 73 is very thin (for example, less than micro-meter), so the area to be contacted by probing can be easily damaged. The conductive layer 71 on the testing area 712 shown in the figure conducts the silicon wafer or circuit board beneath the contact structure via the metal pad 75, which is provided for easy testing and preventing the conductive layer 71 from being damaged.

Figure 8B:
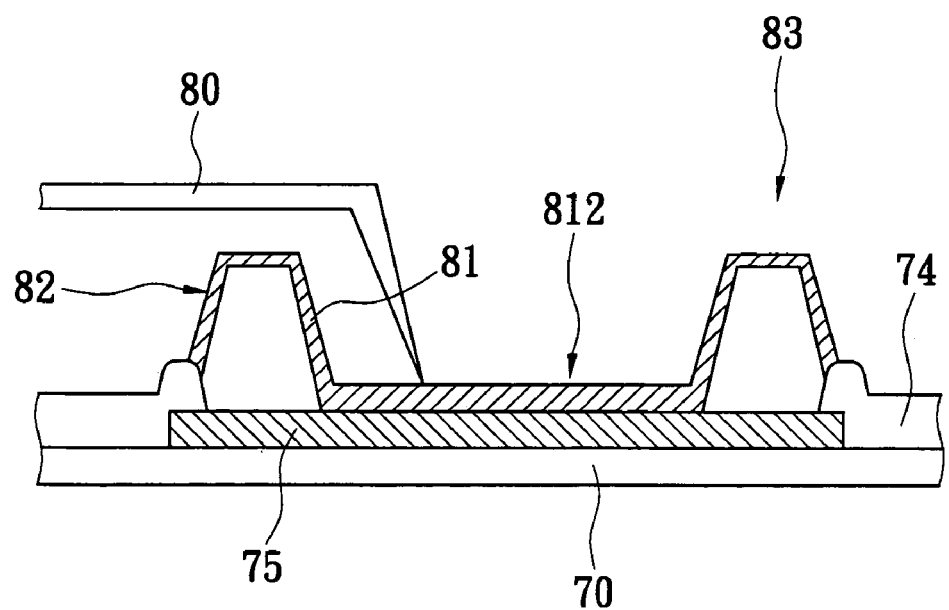

FIG. 8B shows a schematic diagram of the polymeric compliant bumps 82, 83 which are disposed on two ends of the metal pad 75. The metal pad 75 and the polymeric compliant bumps 82, 83 are coated with the conductive material to form a conductive layer 81. The present structure improves the conductive structure of the prior art.

The probe 80 directly contacts the testing area 812 between the two compliant bumps 82, 83 for testing the electrical characteristics of the entire device. The testing area 812 conducts below the substrate, such as the silicon wafer 70, via the metal pad 75 for facilitating easy testing. Thereby, the conductive layer 81 coated on the compliant bumps 82, 83 won't be damaged.

Figure 9A:
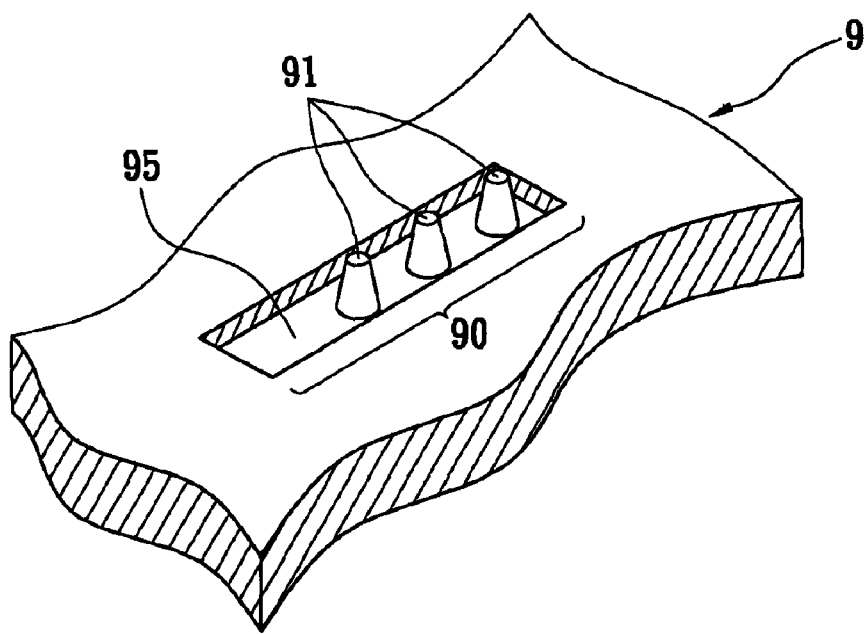
FIGS. 9A through 9C are perspective diagrams of the contact structure of the present invention.
Figure 9B:
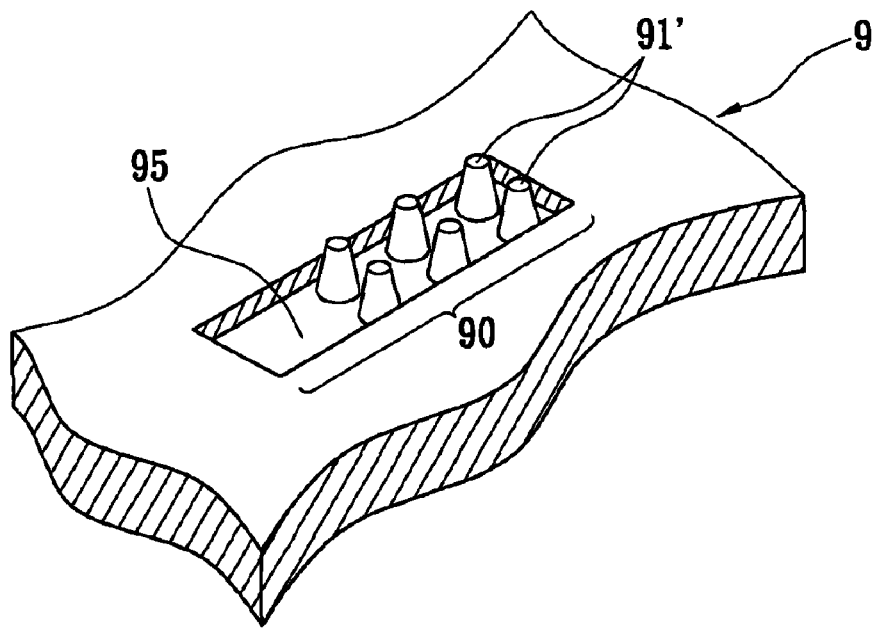
Figure 9C:
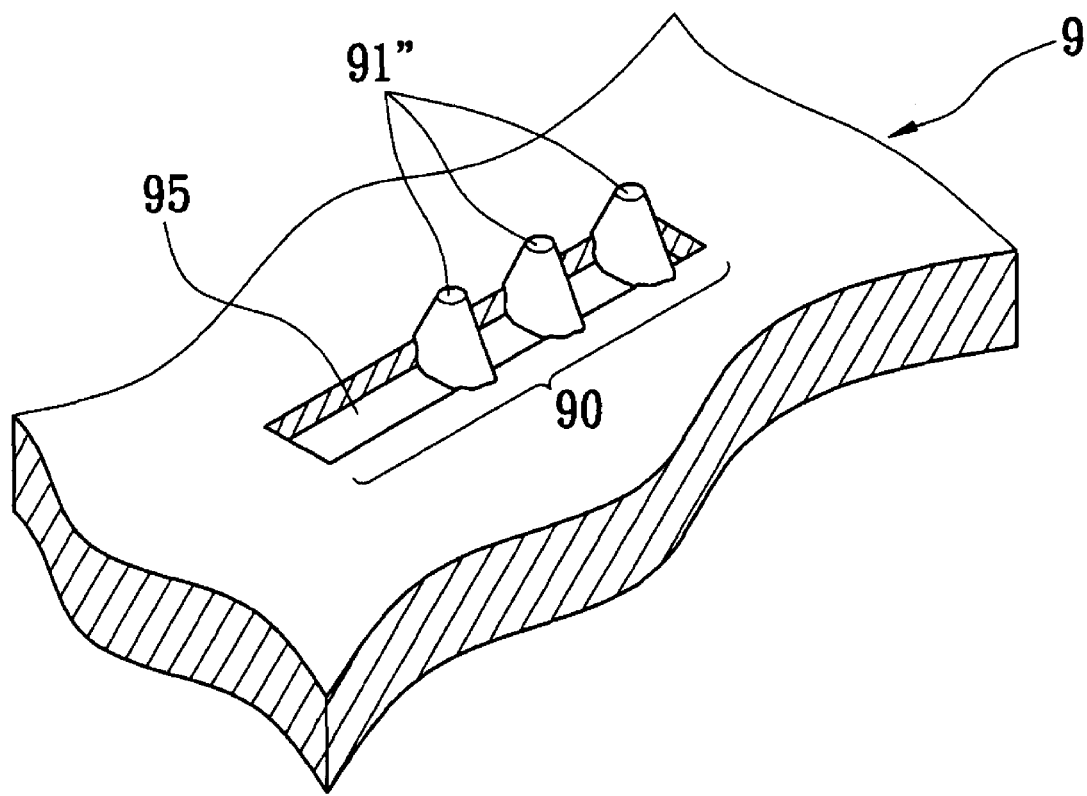

Other embodiments are shown in FIG. 9A to FIG. 9C. The mentioned substrate 9 can be a silicon wafer or a circuit board, wherein the metal pad 90 having both the testing area 95 and the conductive bumps (91, 91', 91") connects to the input/output terminals of the external electronic components. In the preferred embodiment, the cores of the conductive bumps (91, 91', 91") are made of polymeric material, and the contact structure is coated with a conductive layer. The conductive layer coated on the surface of the structure extends to the surface of the testing area 95. Therefore, the testing area 95 is probed instead of the conductive bumps (91, 91', 91") being electrically tested (as in the prior art). Such a method is more convenient and moreover protects the bumps (91,91',91") from being damaged in the testing process.

FIG. 9A shows that the conductive bumps 91 are designed as cone-shaped bumps. In particular, there is a plurality of cone-shaped bumps so as to enhance the reliability of electrical contact.

FIG. 9B shows that the conductive bumps 91' form an array having a plurality of compliant bumps so as to enhance the reliability of electrical contact.

The bigger conductive bumps 91" shown in FIG. 9C provide a larger top area. Referring to the figure, the bottom of the conductive bump 91" crosses the metal pad 90 and covers the substrate 9. This kind of structure enhances the reliability of electrical contact.

Next, FIGS. 10A to 10F show the embodiments of the contact structure of the present invention. As shown in the figures, a substrate 10 can be a silicon wafer or a circuit board. A metal pad 100 is used to connect the input/output terminals of the external electronic components. Similarly, the contact structure has both the testing area and the conductive bumps 101a, 101b, 101c, 101d, 101e, 101f.

Figure 10A:
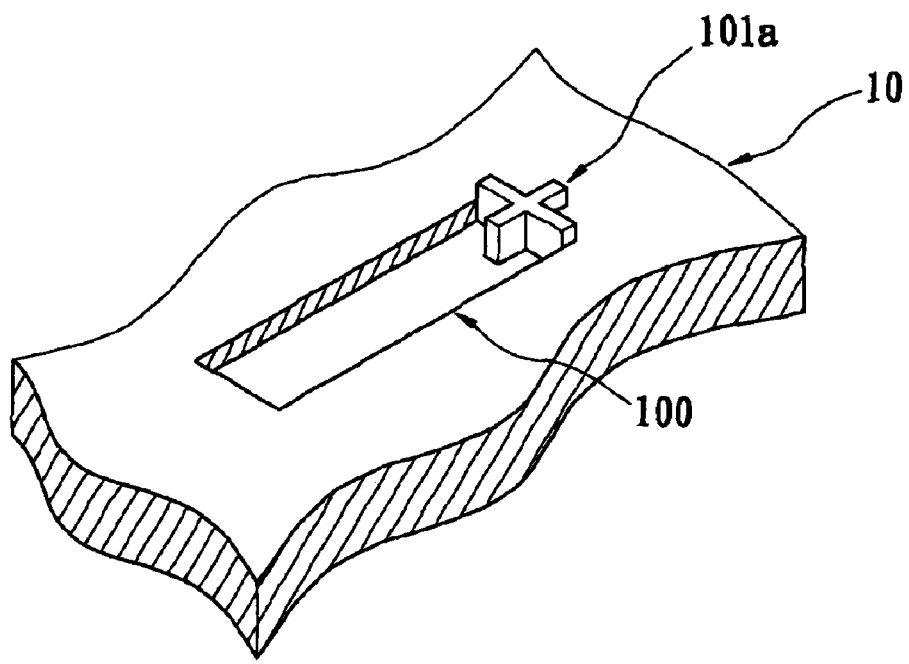
FIGS. 10A through 10F are schematic diagrams of the contact structure of the preferred embodiment of the present invention.

In FIG. 10A, the conductive bump 101a is formed as a cross-shaped bump. By means of a variety of bumps, the conductivity between the contact structure and the mounted electronic components is improved, specifically the structure in a display panel. In particular, the position of the conductive bump 101a is not limited to one end of the metal pad 100 as shown in the figure. The bump can be disposed on any position on the metal pad 100, or even crossing the metal pad 100 and contacting the substrate 10.

Figure 10B:
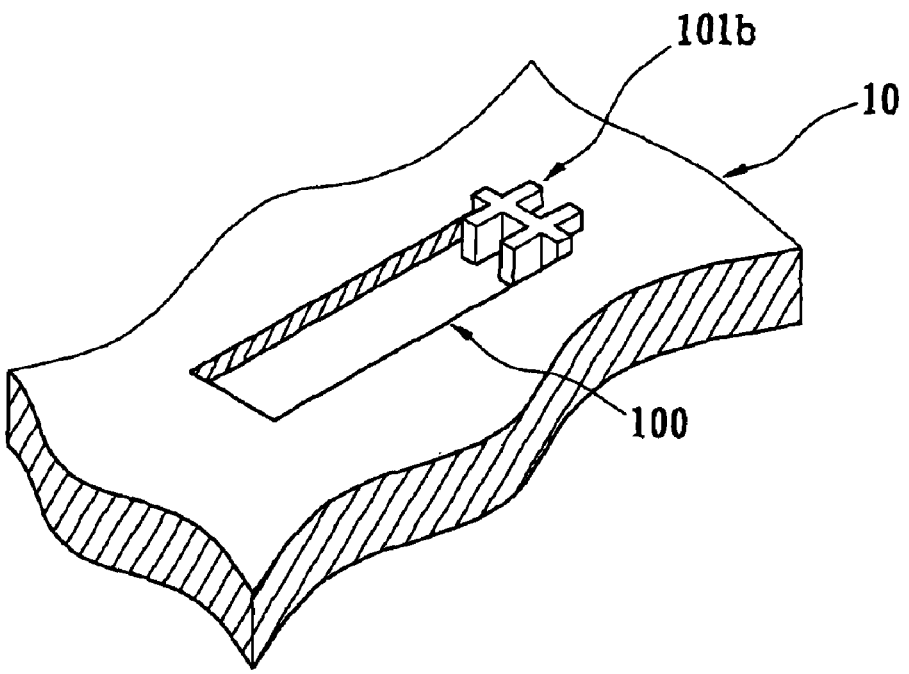

Reference is made to FIG. 10B. The conductive bump 101b of the present invention can have a double-cross-shaped. The position of the conductive bump is not limited to one end of the metal pad 100 as shown in the figure. The bump can be disposed on any position on the metal pad 100, or even crossing the metal pad 100 and contacting the substrate 10.

Figure 10C:
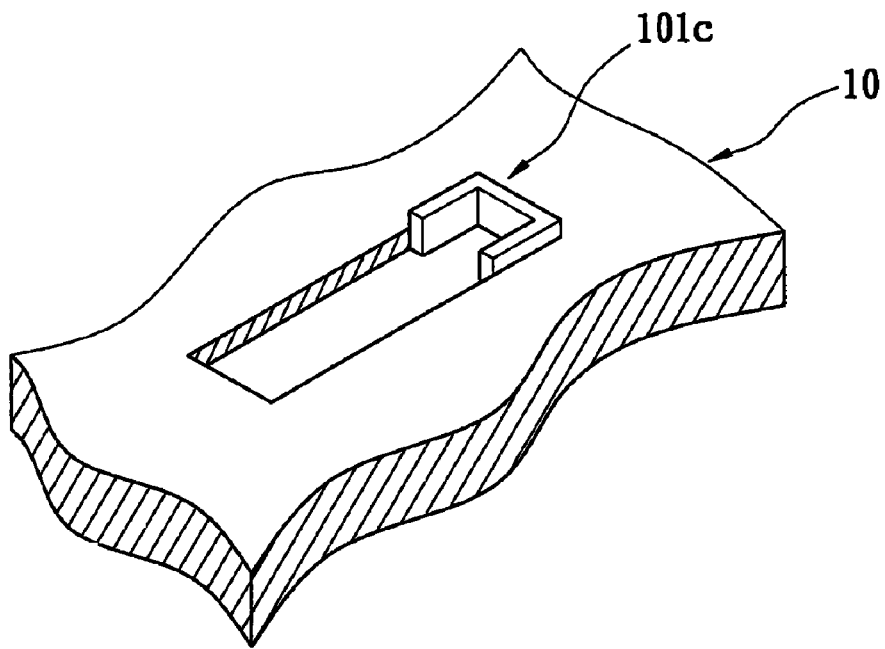

FIG. 10C shows that the conductive bump 101c can be a U-shaped bump. The bump is disposed on the metal pad 100, and is not limited to be disposed on any position shown in the figure. The bump can cross the metal pad 100 and contact the substrate 10.

Figure 10D:
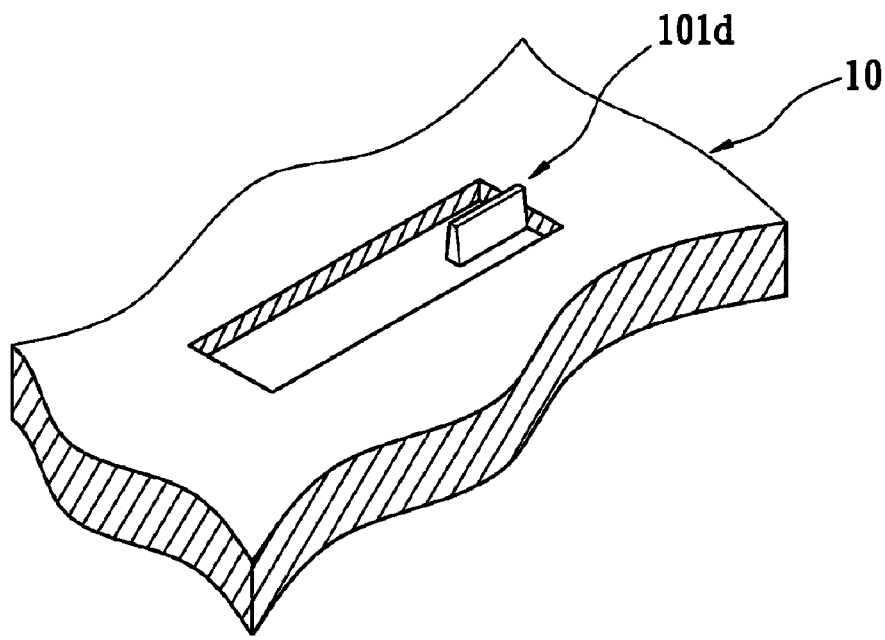
Figure 10E:
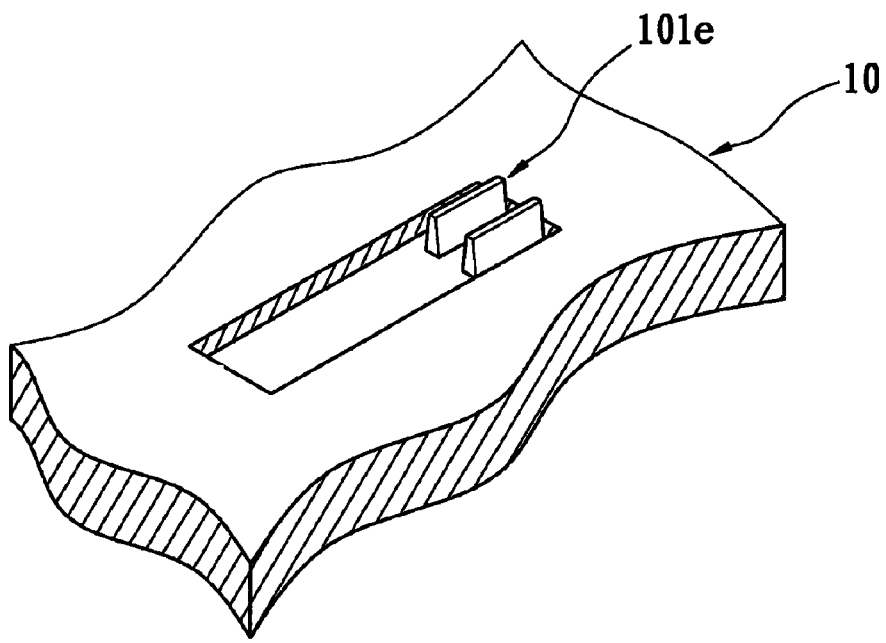

FIG. 10D shows the conductive bump 101d as a bar-shaped bump. FIG. 10E shows the conductive bumps 101e can be formed as a plurality of parallel and bar-shaped polymeric compliant bumps. The bumps can be disposed upon any position on the metal pad 100, or even crossing the metal pad 100 and contacting the substrate 10.

Figure 10F:
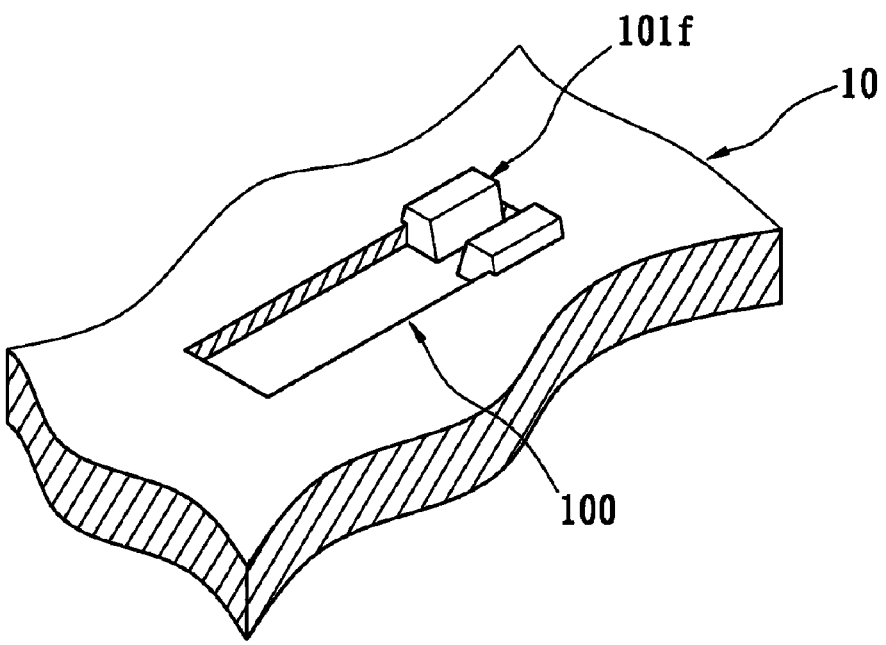

The conductive bump 101f shown in FIG. 10F is made of a plurality of aligned bar-shaped (or two-bar-shaped or three-bar-shaped) compliant bumps. Moreover, the bottom structure of the aligned conductive bumps 101f crosses the two sides of metal pad 100, and covers the substrate 10, so as to enhance the reliability of electrical contact in use.

The embodiments of the above-mentioned conductive bumps are implemented as line-shaped bumps mostly, and the bumps are disposed in the metal pad. Moreover, only one conductive layer is coated on the bumps and the testing area to achieve the electrical probing and conductivity jointly. The line-shaped conductive bumps can increase the contact area used for conducting the bumps and other electronic components.

Figure 11A:
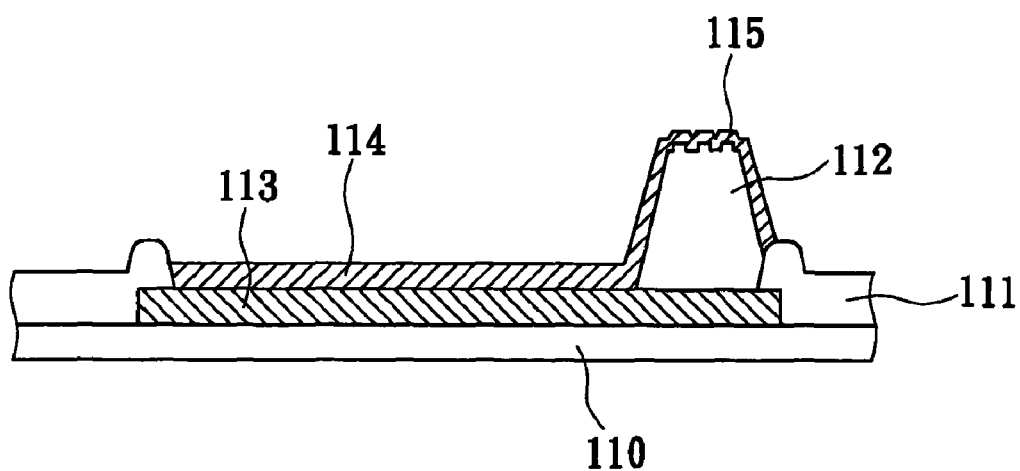
FIGS. 11A through 11D show the contact structure of the embodiment of the present invention.

Another embodiment of the contact structure of the present invention is shown in FIG. 11A. A substrate 110 such as a silicon wafer forms a base, and a metal pad 113 is formed thereon. A passivation layer 111 is disposed on the ambient area surrounding the metal pad 113 for protecting the substrate 110. Moreover, the metal pad 113 is exposed, and a polymeric compliant bump 112 is formed on a side of the metal pad 113. Furthermore, the bump 112 doesn't cover the whole area of the metal pad 113, whereas a conductive layer 114 is coated on the metal pad 113 and the polymeric compliant bump 112, so a testing area on the metal pad 113 is formed on the area not covered by the bump 112.

In this figure, the top surface of the polymeric compliant bump 112 is made of a plurality of micro bumps 115. The micro bumps 115 can be made of a multi-bump structure formed directly on the polymeric compliant bump 112, and formed as a tough surface after being coated with the conductive layer. Furthermore, the micro bumps 115 can also be made of at least one separate micro compliant bump, and coated with the conductive layer. By means of the mentioned micro bumps, the contact structure can achieve the electrical contact with smaller stress during assembly. The plurality of micro bumps can form a single line, multiple lines or an array type.

Figure 11B:
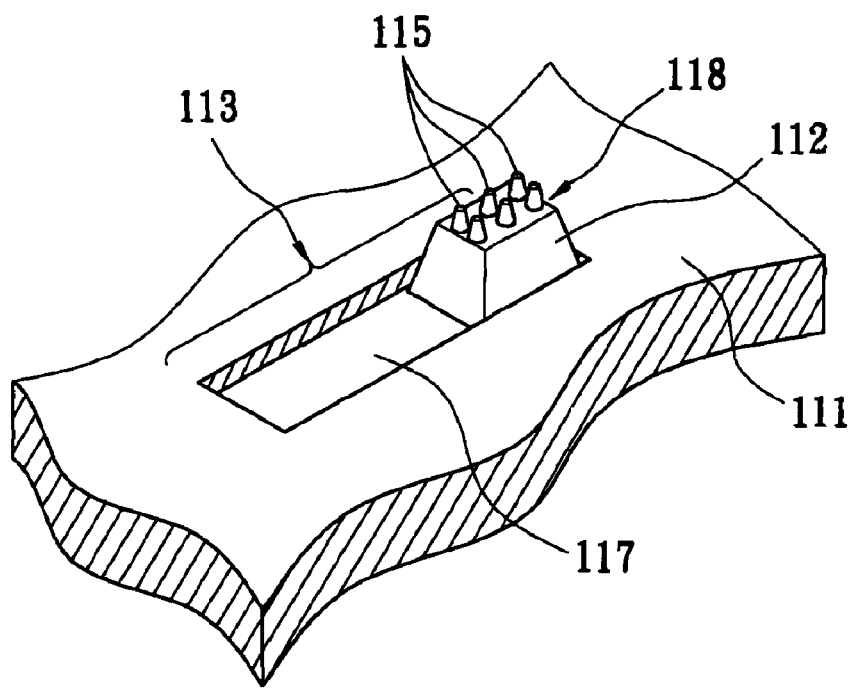

FIG. 11B shows a perspective view of the contact structure in accordance with a preferred embodiment of FIG. 11A. The above structure of the substrate 110 is clearly shown in this diagram, which has the passivation layer 111 and the metal pad 113 covering the substrate 110. The metal pad 113 essentially includes a conductive bump 118 and a testing area 117. The conductive bump 118 is composed of the polymeric compliant bump 112 and the conductive layer 114 coated on the surface. In this preferred embodiment, the conductive bump 118 further includes the micro bumps 115 made of a plurality of particles. A partial structure of the polymeric compliant bump 112 of the other embodiment crosses the passivation layer 111.

Figure 11C:
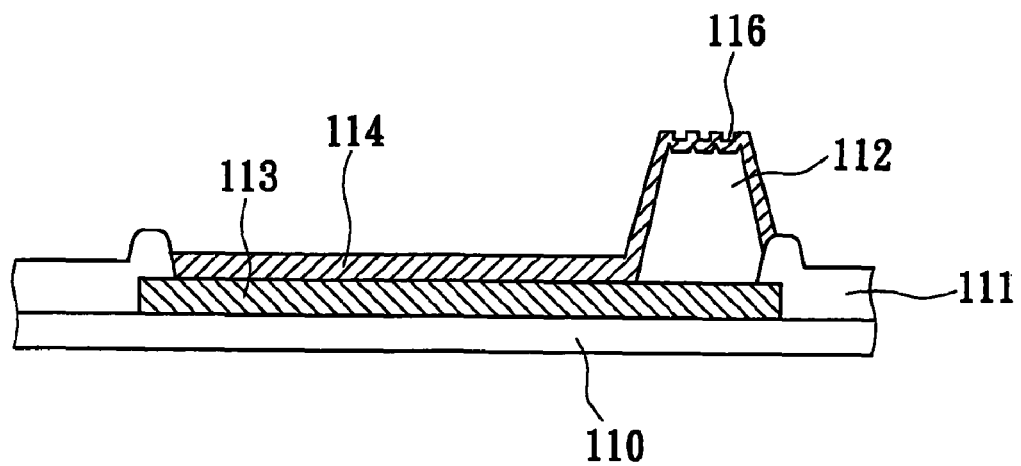

Next, FIG. 11C shows another embodiment of the contact structure. The substrate 110 (such as the silicon wafer) also forms a base. The metal pad 113 is formed thereon, and the passivation layer 111 is formed on the ambient area of the metal pad 113. Moreover, a partial area of the metal pad 113 is exposed to an outside of the surface. The polymeric compliant bump 112 is formed at one end of the contact structure, and just a partial area thereof covers the metal pad 113. A feature of this embodiment is that the top surface of the polymeric compliant bump 112 has a micro concave structure 116 having a plurality of micro holes. The micro concave structure 116 disposed on the conductive layer 114 forms a rough surface on the contact structure. Therefore, by means of the above-mentioned micro concave structure, the contact structure can have electrical contact with less stress during an assembly process with other electronic components. Wherein, the plurality of micro concave structure can form a single line, multiple lines, or an array type.

Figure 11D:
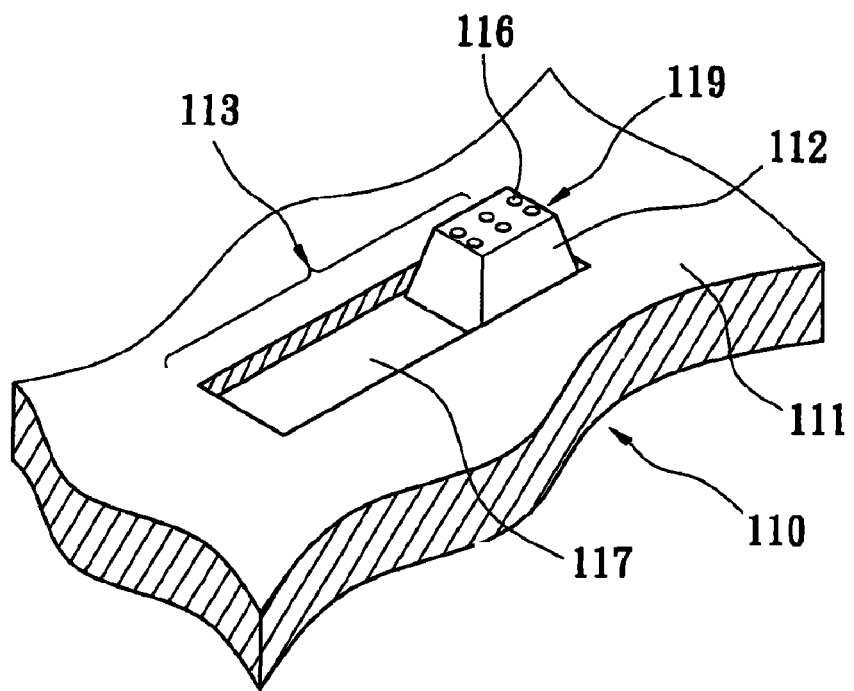

FIG. 11D shows a perspective diagram of the contact structure, wherein the metal pad 113 and the polymeric compliant bump 112 are coated with the conductive layer 114, and form the testing area and conductive (conductive bump 119) area respectively. Above the substrate 110, the passivation layer 111 and the metal pad 113 are formed thereon. Both the testing area 117 and the conductive bump 119 having the plurality of micro concave structures 116 are formed above the metal pad 113. In this embodiment, the conductive bump 119 is the structure formed within the metal pad 113. Furthermore, the conductive bump 119 can be formed crossing the passivation layer 111.

Figure 12:
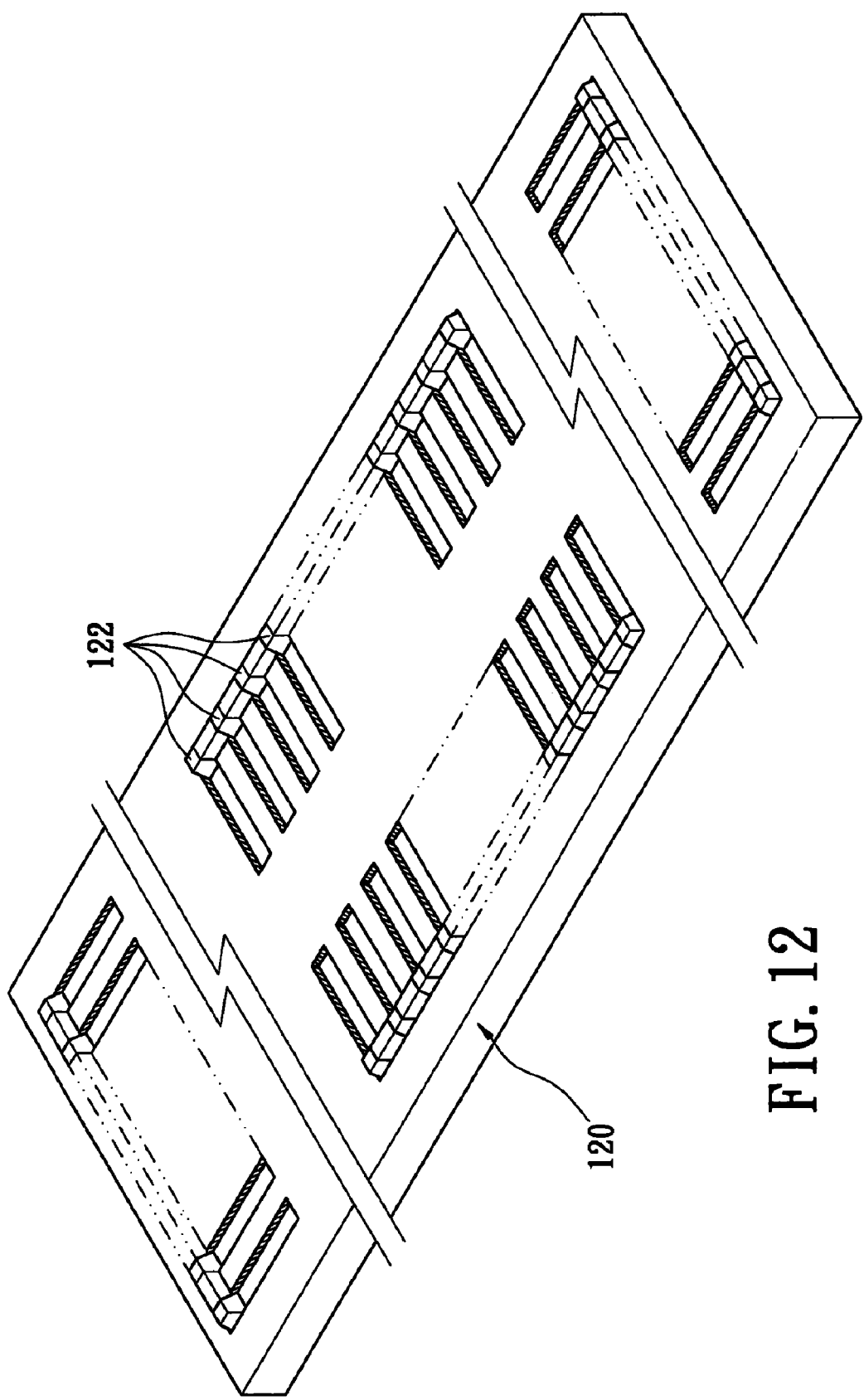
FIG. 12 is a schematic diagram of the contact structure of the present invention.

Reference is made to FIG. 12, which shows a contact structure of the present invention having one or more bar-shaped conductive bumps combining the bumps on the adjacent contact structures in a row. For example, these bar-shaped conductive bumps can be applied for the chip-on-glass (COG), wherein each integrated circuit chip is arranged to electrically couple with a glass substrate and the external circuit. In this figure, since the conductive bumps of the contacts on the substrate 120, such as the mentioned IC chip, are disposed regularly, the adjacent polymeric compliant bumps 122 can be manufactured as bar-shaped bumps. After that, the bar-shaped bumps are coated with a conductive layer to form bar-shaped conductive bumps.

Figure 13A:
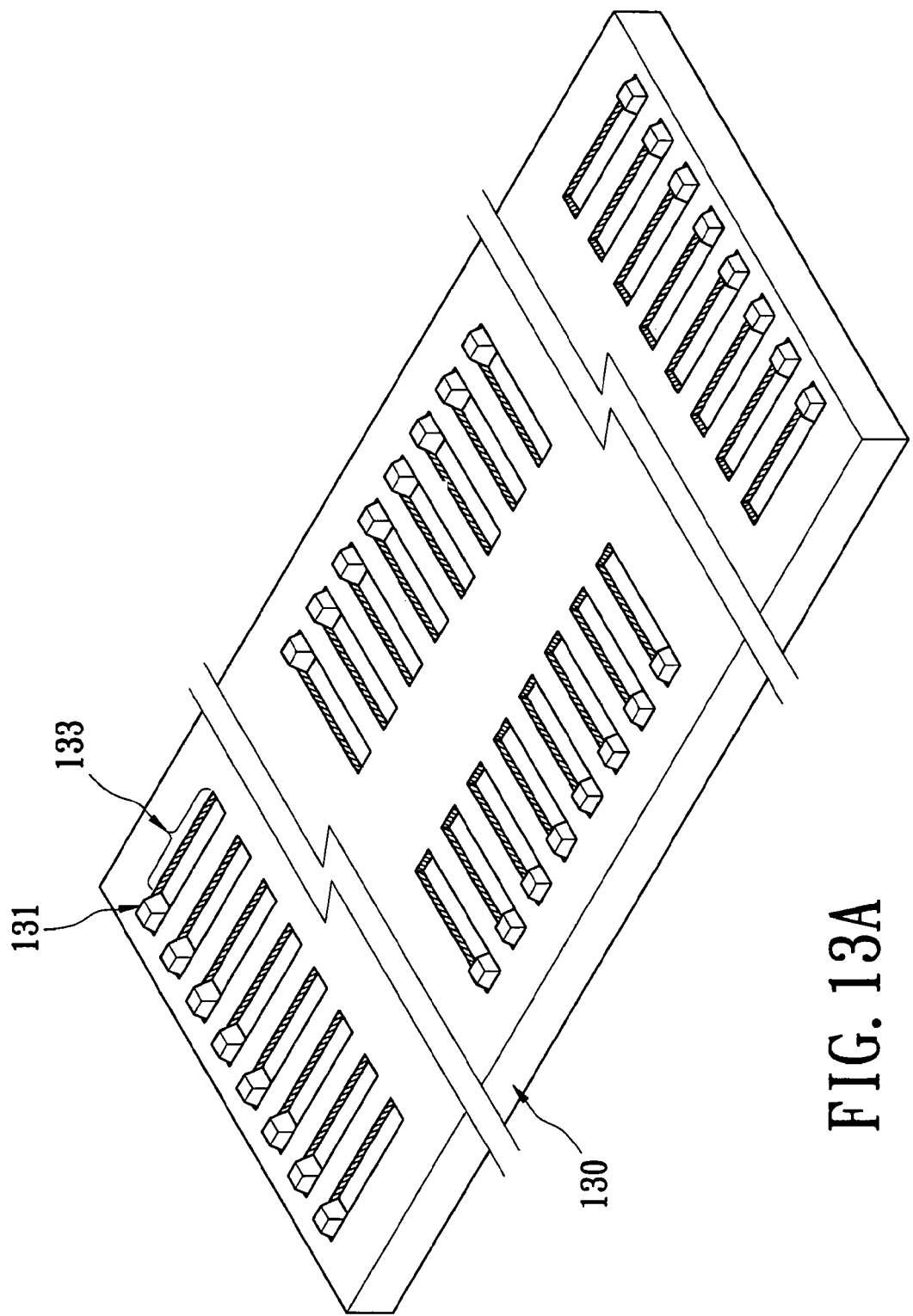
FIG. 13A and FIG. 13B show the contact structure disposed on a substrate of the preferred embodiment of the present invention.

FIG. 13A shows a perspective diagram of the embodiment of the present invention. A plurality of contact structures is disposed regularly on a substrate 130, such as the IC chip of the embodiment. Each contact structure has both a conductive bump 131 and a testing area 133 disposed on the metal pad. The conductive bump 131 is a compliant bump coated with the metal conductive layer, and the metal conductive layer is coated on the partial surface or entire surface area of the compliant bump.

Figure 13B:
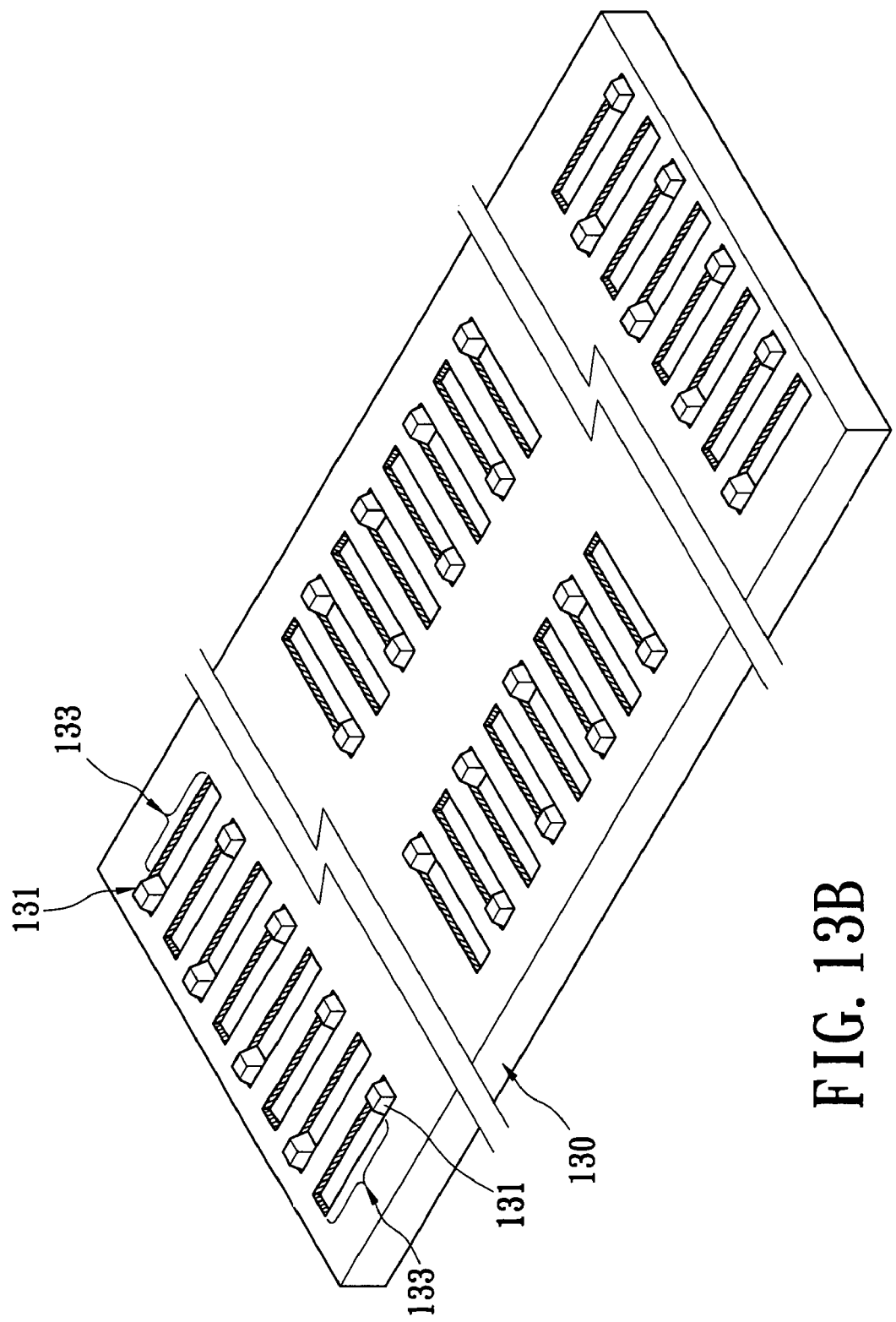

FIG. 13B shows the conductive bumps 131 formed on the adjacent contact structures are disposed irregularly. In this embodiment, the adjacent conductive bumps 131 and the testing areas 133 are formed on the ends of the metal pads, but not arranged in a row. Furthermore, another embodiment shows the adjacent conductive bumps 131 and the testing area 133 are disposed on any position of the metal pad.

Figure 14:
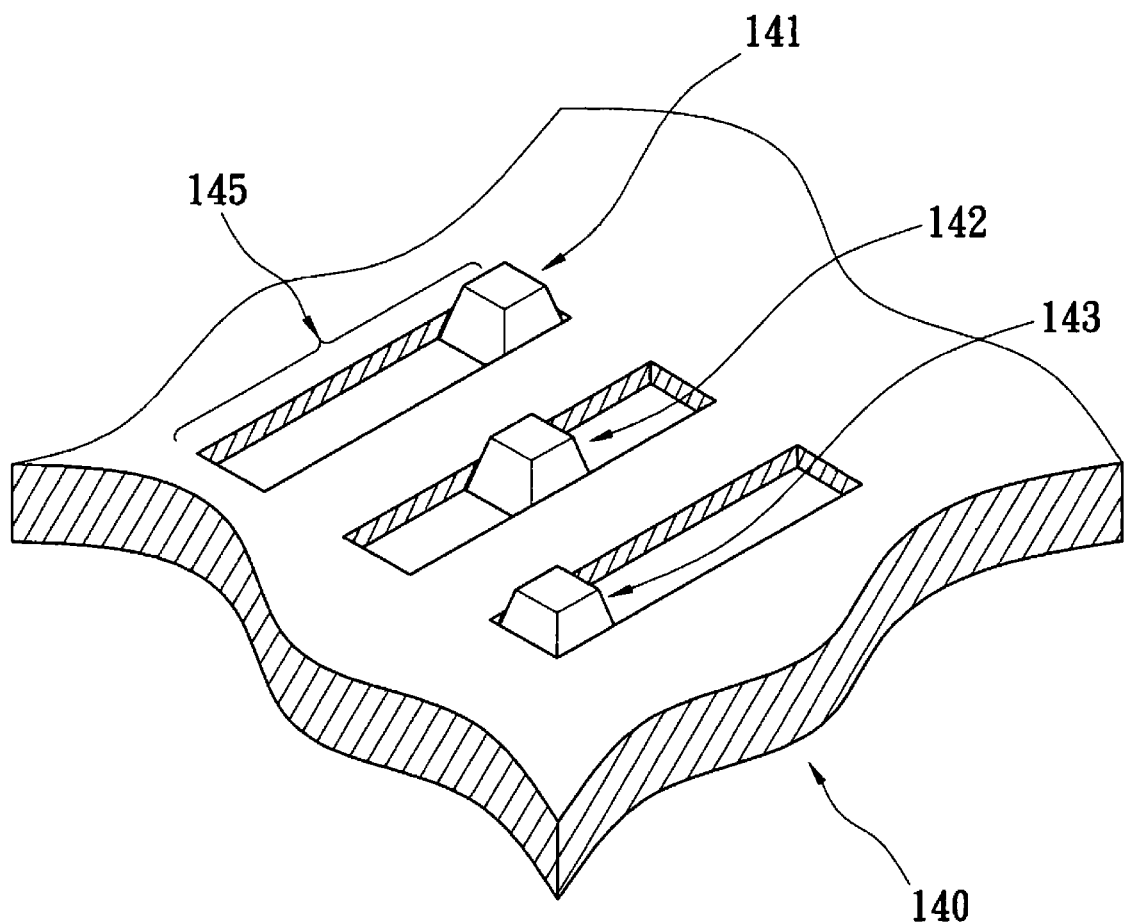
FIG. 14 is a schematic diagram of the contact structure arranged on the substrate of the present invention.

FIG. 14 shows a plurality of contact structures disposed on a substrate 140, and the conductive bumps 141,142,143 are arranged irregularly. The conductive bumps can be disposed on any part of the metal pads 145, even any position except for outside of the pads 145. Furthermore, each conductive bump includes only one conductive layer, and this conductive layer is coated on the position occupied by the compliant bump and position of the metal pad 145 unoccupied by the bump. Therefore, the position unoccupied by the compliant bump can be used for probing, wherein the conductive layer directly conducts the metal pad 145 below, and conducts the substrate 140, so as to form a convenient testing area.

The conductive bump disclosed in aforementioned embodiments is the structure occupying part of the metal pad. The preferred embodiment shows the metal pad's area occupied by the bump being under 90 percent.

The contact structure disclosed in the present invention can be used for assembling a flip chip. For example, the driving IA chips and the electronic components used for the liquid crystal display are disposed on a thin-film directly for achieving a slim and small device, namely the Chip on Film (COF) technology. The contact structure of another embodiment is used for assembling a flip chip on a glass substrate (COG), namely the chip being flipped and assembled on the glass substrate. In particular, the mentioned substrate can be an organic or inorganic material such as ceramic, metal, glass, or polymeric material.

The conductive bump forms a compliant bump having a core made of a polymeric material, which can be polymide (PI), epoxy, or acrylic . . . etc. After patterning the polymeric material layer, the compliant structure is formed on a partial area of the metal pad. Since the compliant structure is provided, the reliability of compliant contact is formed during the assembly process of the electronic components. The area not covered by the conductive bump is provided for testing by a probe.

Figure 15:
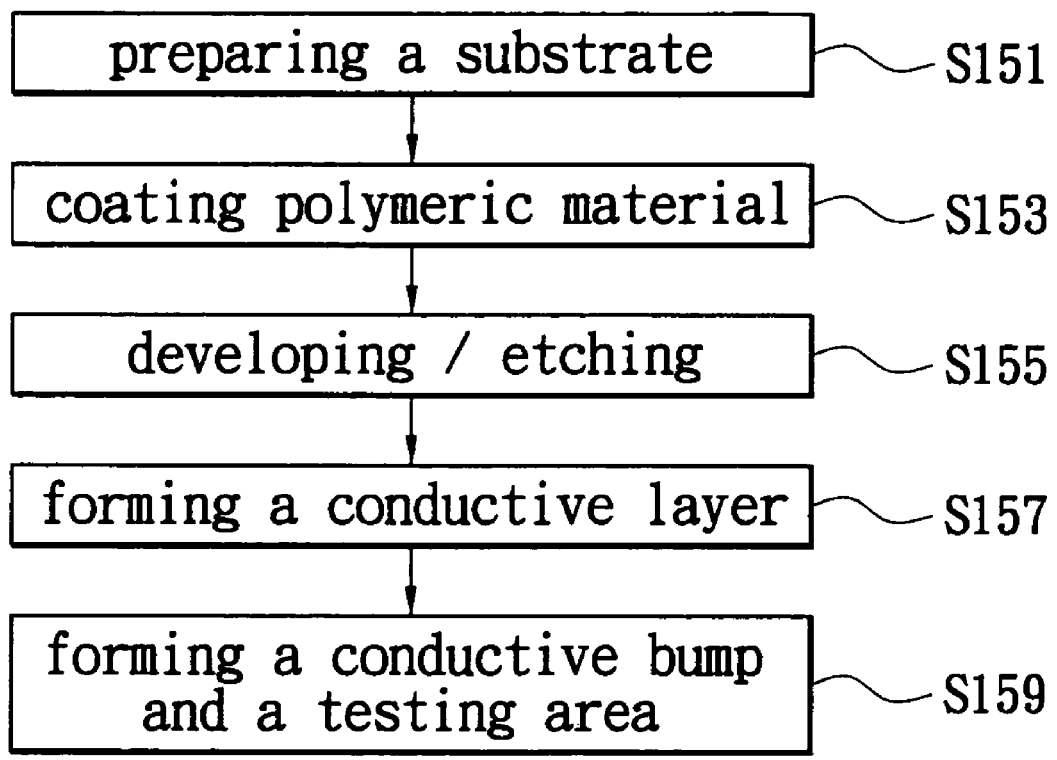
FIG. 15 is a flow chart of the manufacturing method of the present invention.

FIG. 15 shows a flow chart of the major steps of the method for manufacturing the contact structure. The preferred embodiment of the contact structure having both the compliant bump and the testing area is applied for the metal pad having an input contact, an output contact, and a passivation layer.

To begin the manufacturing steps, a substrate is prepared, and the substrate has at least one metal pad which is a contact structure (which can be an aluminum electrode). The electrodes are the input/output contacts used as an electrical contact of the device (step S151). After that, a polymeric material is coated upon the substrate, namely on the contact structure (step S153). Next, the polymeric material is patterned by means of developing/etching, such as a dry etching means or a wet etching means, in accordance with the requirements of the contact structure (step S155). In the other embodiment of step. S155: the polymeric material is a kind of photosensitive material, so it can be etched by a light source. Namely, a photosensitive area of the polymeric material is exposed under an optical mask by ultraviolet radiation. After eliminating the mask, the occupied area for a bump is formed on the partial area occupied by the metal pad.

Next, the patterned polymeric material forms a compliant bump on the metal pad. After that, a conductive layer is coated thereon, so as to form the conductive layer. For example, a metal material is formed by the process of sputtering or photo-etching on the compliant bump and the area to be tested. Afterward, the compliant bump forms a conductive bump (step S157). Therefore, the metal pad is separated into a conductive bump area and a testing area (step S159).

The conductive bump and the testing area are electrically coupled by means of the conductive layer. The test for the device uses a probe to contact the testing area directly, so the electric characteristics of the contact structure having the conductive bump can be tested precisely without damaging the metal layer on the conductive bump.

Figure 16:
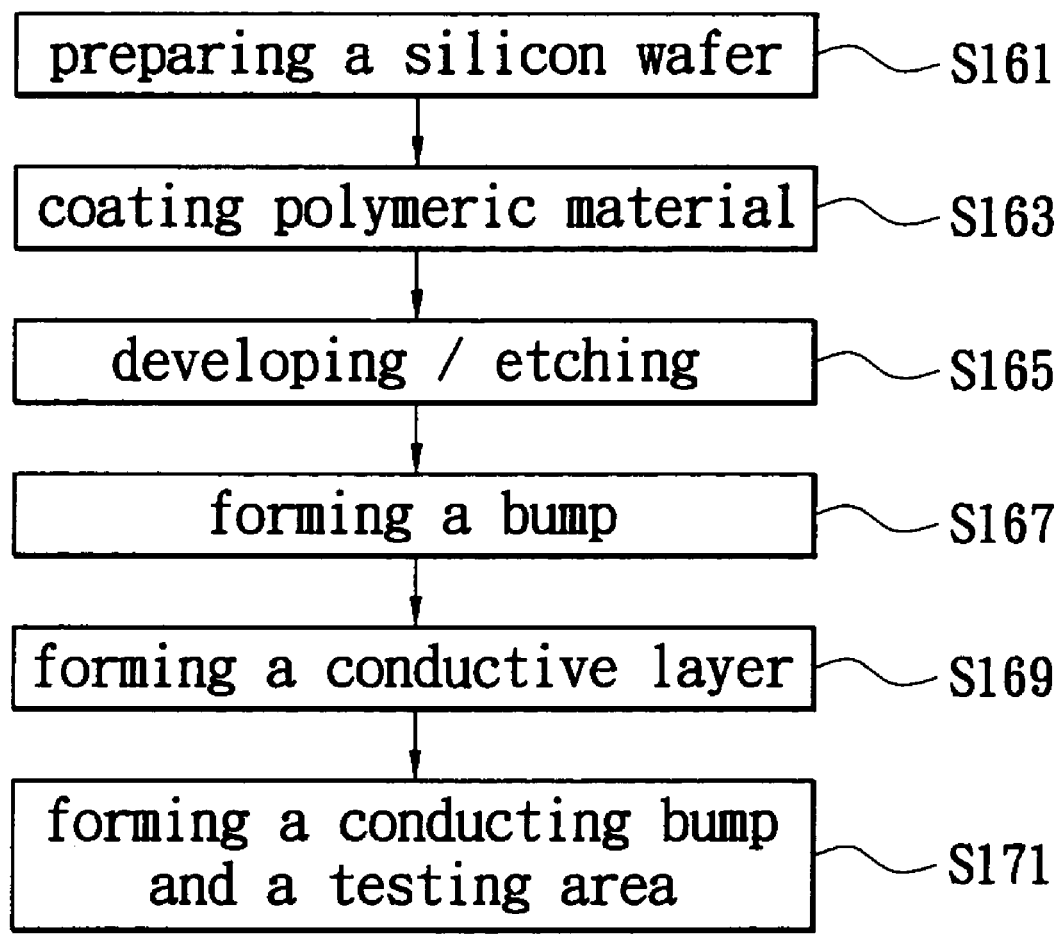
FIG. 16 is a flow chart of the manufacturing method of another embodiment of the present invention.

The contact structure of the present invention is applied to the integrated circuit chip. FIG. 16 shows a flow chart of the manufacturing method.

A silicon wafer is prepared, and the wafer includes a metal pad formed as an input/output terminal, and a passivation layer which is used to protect the body of the wafer (step S161).

Next, the silicon wafer is coated with the conductive layer (step S163). After that, by means of developing/etching, the polymeric material is patterned under the optical mask, and the useless part is eliminated, so as to form one or a plurality of compliant bumps and the testing area on the metal pad (step S165).

In this embodiment, a plurality of micro bumps is manufactured upon the mentioned compliant bump, then the contact structure can achieve the electrical contact with smaller stress during an assembly process for the IC chips and other electronic components (step S167).

For example, the mentioned polymeric compliant bump is directly formed as a bump with a plurality of convex structures, so as to form a touch surface. In another embodiment, a plurality of independent micro concave bumps is formed on the compliant bump. In particular, the micro bumps can be formed as a single line, multiple lines, an array, or an interlaced type.

After that, the structure is coated with a conductive layer, which can be formed by means of sputtering and photo-etching (step S1169). In the meantime, a conductive bump is formed on the partial area of metal pad occupied by the bump, and a testing area is formed on the area unoccupied by the bump (step S171).

The above-mentioned embodiments disclose the main features of the present invention, including:

(1) the conductive compliant bump can be disposed on any position of the metal pad in accordance with actual requirements;
(2) the conductive compliant bump occupies the partial area of the metal pad;
(3) the metal pad is separated into a bump area and a probe testing area;
(4) the conductive compliant bump is formed within the metal pad or partially crossing the metal pad;
(5) the conductive material covers a partial or an entire surface area of the conductive compliant bump;
(6) the conductive compliant bump can be rectangular, circular, or triangular in shape, or any combination thereof;
(7) the conductive compliant bump can have a rough surface; and
(8) the area of the metal pad occupied by the conductive compliant bump is less than 90 percent.

In summary, the present invention relates to a contact structure having both a compliant bump and a testing area, and a manufacturing method thereof. The present invention allows the reduction in size of bumps and the recovering force when assembling the structure. Furthermore, the testing area is used in order that the device may be tested conveniently, and costs are reduced due to only one metal layer being used.

The many features and advantages of the present invention are apparent from the written description above and it is intended by the appended claims to cover all. Furthermore, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A contact structure, comprising:
a plurality of metal pads;
a passivation layer disposed above the plurality of metal pads and exposing a portion of each of the plurality of metal pads;
a plurality of polymeric compliant bumps each disposed over at least a part of the passivation layer, the plurality of polymeric compliant bumps being separate from one another, the entirety of each of the polymeric compliant bumps being formed above a corresponding one of the plurality of metal pads;
a plurality of testing areas each defined adjacent to a corresponding different one of the plurality of polymeric compliant bumps; and
a conductive material that forms a conductive metal layer partially covering a surface of each of the plurality of polymeric compliant bumps so as to form a plurality of conductive bumps, and covering the plurality of testing areas, wherein each of the plurality of the covered polymeric compliant bumps and each of the plurality of testing areas are formed in a surface of a corresponding one of the plurality of metal pads.

2. The contact structure of claim 1, wherein each of the plurality of metal pads is disposed on a substrate.

3. The contact structure of claim 2, wherein the substrate is an organic or an inorganic material including ceramic, metal, glass, polymeric or silicon.

4. The contact structure of claim 2, wherein the substrate is a silicon wafer.

5. The contact structure of claim 4, wherein the passivation layer is disposed over a part of the silicon wafer.

6. The contact structure of claim 1, wherein the contact structure is an input/output contact.

7. The contact structure of claim 1, wherein the polymeric compliant bump is made of polyimide (PI), epoxy, or acrylic.

8. The contact structure of claim 1, wherein the shape of the polymeric compliant bump is pyramid-shaped, cone-shaped, bar-shaped, cross-shaped, double cross-shaped, or U-shaped.

9. The contact structure of claim 1, wherein a plurality of micro bumps or micro holes is formed on the top of the polymeric compliant bump.

10. The contact structure of claim 9, wherein the plurality of micro bumps or micro holes forms a rough surface in a form of a single line, multiple lines, or an array type.

11. The contact structure of claim 1, wherein the polymeric compliant bump is composed of more than one separate compliant bump.

12. The contact structure of claim 1, wherein an external compliant bump is disposed on the outside of the polymeric compliant bump corresponding to the contact structure.

13. The contact structure of claim 12, wherein the external compliant bump is a dummy bump.

14. The contact structure of claim 12, wherein the surface of the external compliant bump is fully or partially coated with the conductive material.

15. The contact structure of claim 1, wherein each of the plurality of polymeric compliant bumps is of a pyramid shape or a cone shape.

* * * * *